(12) United States Patent
Gross

(10) Patent No.: US 6,759,309 B2
(45) Date of Patent: Jul. 6, 2004

(54) MICROMACHINED STRUCTURES INCLUDING GLASS VIAS WITH INTERNAL CONDUCTIVE LAYERS ANODICALLY BONDED TO SILICON-CONTAINING SUBSTRATES

(75) Inventor: Harald S. Gross, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 58 days.

(21) Appl. No.: 10/160,215

(22) Filed: May 28, 2002

(65) Prior Publication Data

US 2003/0224559 A1 Dec. 4, 2003

(51) Int. Cl.⁷ .............................................. H01L 21/30
(52) U.S. Cl. ....................................................... 438/455
(58) Field of Search .............................. 438/26, 51, 55, 438/64, 455, 456

(56) References Cited

U.S. PATENT DOCUMENTS

| | | | |
|---|---|---|---|
| 4,525,766 A | 6/1985 | Petersen | 361/283 |
| 5,132,648 A | 7/1992 | Trinh et al. | 333/128 |
| 5,346,854 A | 9/1994 | Ahn et al. | |
| 5,426,072 A | 6/1995 | Finnila | |
| 5,565,262 A | 10/1996 | Azzaro et al. | 428/210 |
| 5,584,956 A | 12/1996 | Lumpp et al. | 156/272.8 |
| 5,648,302 A | 7/1997 | Brow et al. | 501/50 |
| 5,656,553 A | 8/1997 | Leas et al. | 438/15 |
| 5,998,292 A | 12/1999 | Black et al. | 438/597 |
| 6,124,145 A | * 9/2000 | Stemme et al. | 438/26 |

OTHER PUBLICATIONS

R. de Reus et al., "Reliability of industrial packaging for microsystems", *Microelectronics Reliability*, vol. 38, pp. 1251–1260 (1998).
H. S. Gross et al., "Fabrication and characterisation of an array of miniaturized electrostatic multipoles", *Microelectronic Engineering*, vol. 41/42, pp. 489–492 (1998).
X. Li et al., "High Density Electrical Feedthrough Fabricated by Deep Reactive Ion Etching of Pyrex Glass", Technical Digest, MEMS 2001, from the 14ᵗʰ IEEE International Conference on Micro Electro Mechanical Systems, pp. 98–101 (Jan 2001).

* cited by examiner

*Primary Examiner*—Kamand Cuneo
*Assistant Examiner*—Scott B. Geyer
(74) *Attorney, Agent, or Firm*—Shirley L. Church

(57) ABSTRACT

Disclosed herein are methods of preparing vertical electrical interconnects within multiple layers of substrates, where a portion of the substrate layers are glass and a portion of the substrate layers are single-crystal silicon. The methods taught herein can be used to prepare basic "units" which can be stacked and anodically bonded together to form electrically connected, multi-unit structures. The methods of the invention are particularly advantageous in the fabrication of microcolumns, and especially an array of microcolumns of the kind used in electron optics, including electron microscopes and lithography apparatus.

46 Claims, 14 Drawing Sheets

MICROMACHINED STRUCTURES INCLUDING GLASS VIAS WITH INTERNAL CONDUCTIVE LAYERS ANODICALLY BONDED TO SILICON-CONTAINING SUBSTRATES

FIELD OF THE INVENTION

The present invention pertains to the formation of vertical electrical interconnects within multiple layers of substrates, wherein a portion of the substrate layers are glass and a portion of the substrate layers are single-crystal silicon. Layers of other materials may be present as well. The invention is particularly advantageous in the fabrication of microcolumns, and especially an array of microcolumns of the kind used in electron optics, including electron microscopes and lithography apparatus.

BACKGROUND OF THE INVENTION

As the size requirements for various electromechanical devices continue to diminish, there has been substantial interest in the manufacture of micro-electromechanical structures (MEMS). A typical MEMS structure incorporates at least one electrical device in combination with one or more mechanical device. Various attempts have been made to produce MEMS structures using common semiconductor processing techniques, such as chemical vapor deposition (CVD), physical vapor deposition (PVD), and plasma etching. However, a typical MEMS structure is considerably larger than a typical semiconductor structure. The layers of materials used in a typical MEMS structure tend to be much thicker and cover a greater surface area than those used in conventional semiconductor devices. Therefore, depositing a layer of material using a CVD or PVD technique, or etching a material layer using plasma etching, can be too slow, such that the amount of time required to manufacture a MEMS structure using these techniques is prohibitive.

Many MEMS structures utilize various electronic devices etched out of silicon wafers. These electronic devices are then electrically isolated from each other by a layer of dielectric material. Recent work has focused on the use of glass sheets in lieu of dielectric layers which have been deposited using conventional semiconductor deposition techniques (which, as discussed above, are typically too slow to be practical for use in the deposition of dielectric layers of sufficient thickness for MEMS applications). Stacks of alternating layers of glass and conductive material (such as silicon) can be bonded together to produce various MEMS structures.

Anodic bonding has been one of the techniques used to bond the conductive layer to the glass layer. In some instances, a semiconductor material such as silicon is used as the conductive layer, and the glass layer is a borosilicate glass, such as PYREX® or BOROFLOAT® (Schott Glass Technologies, New York, N.Y.). In the alternative, the glass layer may be a lithium aluminosilicate-β-quartz glass-ceramic, such as Prototype PS-100, available from HOYA Co., Tokyo, Japan. The advantage of this latter glass is that anodic bonding may be performed at a temperature of about 180° C.

In order for the MEMS structure to function as a whole, it may be advantageous to form vertical electrical interconnects between the various conductive layers which have been electrically isolated from one another by sheets of glass. Because the interconnect is sealed within a multilayered sandwich and is difficult (if not impossible) to repair, it is important to obtain a robustness of these interconnects which is higher than wire bonding. A robust interconnect can be used in a harsh environment. To produce vertical electrical interconnects between conductive or semiconductive layers in a multilayered structure, there are a number of different possibilities, some of which are summarized below.

U.S. Pat. No. 4,525,766, issued Jun. 25, 1985, to Kurt E. Petersen, discloses a hermetically sealed electrical feedthrough conductor formed across the periphery or boundary between a hermetically sealed region on a semiconductor substrate and a second or external region thereof. A planar insulative layer is formed on the surface of the semiconductor (silicon) substrate along the predetermined path of the feedthrough conductor across the periphery of the insulative layer. The insulative layer has at least one planar projection on each side thereof which extends out to a point. Subsequently, a planar metal feedthrough conductor layer is applied which substantially covers the insulative layer, including planar projections. An insulator element sized to encapsulate the region to be sealed is then mallory bonded (anionic bonded) to the periphery, including the feedthrough conductor. The planar projections are said to form a compression bond that eliminates any tenting region that would otherwise form beneath the insulator element at the edges of the feedthrough conductor and the underlying insulative layer. The electrical feedthrough connections formed in this manner are generally in the same horizontal plane as the surface of the semiconductor substrate on which they are formed.

U.S. Pat. No. 5,584,956, issued Dec. 17, 1996, to Lumpp et al., describes a method for producing feedthroughs in a substrate having a front surface and a back surface. A sheet of material is bonded to the substrate using an adhesive. A laser is then used to form a hole through the substrate, where the laser radiation has a given wavelength at a power sufficient to ablate a hole through the substrate and a portion of the sheet behind the substrate, thereby creating a feedthrough in the substrate. The sheet of material may be conductive or an insulator. If the sheet is conductive, the sheet may remain bonded to the substrate to serve as a ground plane for the substrate. If the sheet is an insulator, the feedthrough is an insulated feedthrough, and if the sheet is conductive, the feedthrough is a conductive feedthrough. The procedure can be extended to produce a two-conductor feedthrough, where a wire is inserted, as illustrated in FIG. 6d, to produce a structure useful as a coaxial cable.

U.S. Pat. No. 5,656,553, issued Aug. 12, 1997, to Leas et al., illustrates a prior art approach to the problem of fabricating microcolumns of chips. As in other prior art, the assembly and subsequent contacting of the ICs in the stack is done after dicing of the chip or chip arrays out of the silicon wafers. In addition, the conductive interconnections disclosed can be said to be "three dimensional" only in the rather limited sense that "side surface metallization" is applied to the peripheral edges of planar arrays of integrated chips subsequent to the dicing of the wafer.

In an article by R. De Reus et al. in Microelectronics Reliability (Vol. 38, pp. 1251–1260 (1998)), entitled "Reliability of Industrial Packaging For Microsystems", the authors discuss packaging concepts for silicon-based micromachine sensors exposed to harsh environments. Various protective coatings of specialized materials, glue types, and thin-film anodic silicon-to-silicon wafer bonding processes are described. Through-hole electrical feedthroughs with a minimum line width of 20 $\mu$m and a density of 250 wires per centimeter were obtained by applying electro-depositable photoresist. Hermetically sealed feedthroughs were obtained using glass frits, where the seal is said to withstand pressures of 4000 bar.

U.S. Pat. No. 5,998,292, issued Dec. 7, 1999, to Black et al., describes a method for interconnecting, through high-density micro-post wiring, multiple semiconductor wafers with lengths of about 1 millimeter or less. Specifically, the method comprises etching at least one hole, defined by walls, at least partly through a semiconductor material; forming a layer of electrically insulating material to cover the walls; and forming an electrically conductive material on the walls within the channel of the hole. The micro-post wiring may be used in devices of the kind described in the patent.

In an article by Xiaghua Li et al. entitled "High density electrical feedthrough fabricated by deep reactive ion etching of Pyrex glass" (Technical Digest, MEMS 2001, from the 14$^{th}$ IEEE International Conference on Micro Electro Mechanical Systems, pp. 98–101 (Jan 2001)), the authors describe a fabrication technology for producing PYREX® glass (manufactured by Corning Glass of Corning, N.Y.) with a fine pitch electrical feedthrough. Small through-holes (40–60 $\mu$m in diameter) were fabricated using deep reactive ion etching in sulfur hexafluoride plasma. The through-holes were subsequently filled with nickel using pulse electroplating. The authors further comment that PYREX® glass can be anodically bonded with silicon, although they provide no example of the bonding process. Applications mentioned for use of the technology are micro-probe arrays used for high density data storage and packaged devices.

Within the field of integrated circuit (IC) fabrication, there is continuing interest in finding ways to increase the density of electronic parts such as transistors, and to shrink the electrical interconnections for these parts. Since the invention of microcolumns of silicon chips, only single columns have been assembled from a stack of micromachined silicon chips. In order to be able to contact each chip electrically, a stack of chips typically has a pyramidal structure. This allows wire bonding from each chip of the pyramid to a base plate through which electrical contact may be made. In the future, arrays of microcolumns will be needed. For the assembly of ten or more columns in an array, the pyramidal structure is not practical, depending on the required footprint and processing restrictions. In particular, monolithic designs of arrays require a different connection scheme than wire bonding. Therefore, there is a need for an electrically connected, multilayered structure which can be easily fabricated, without the limitations of a pyramidal structure.

SUMMARY OF THE INVENTION

We have developed a structure (and a method of forming the structure) which is used within a larger multilayered structure to transfer electrical signals vertically through the multilayered structure. The structure includes layers of glass which are anodically bonded to layers of conductive and/or semiconductive materials. The layers of glass act as a spacer, electrical isolator, and a soldering material between the conductive or semiconductive layers in the structure of the invention. At least a portion of the layers of glass within the structure include a through-hole, the interior surface of which is coated with an electrically conductive material which is sufficient to transfer electrical signals vertically through the glass layer in which they are present. Preferably, the conductive material is a metal which is evaporated through a shadow mask at an angle, or sputtered through a shadow mask, into the through-holes in the glass layer.

To prepare the openings through the glass layer, the openings may be ultrasonically drilled, wet chemically etched, or laser drilled, for example and not by way of limitation. Laser drilling has provided a smoother finish on the opening surfaces. It is also possible to plasma etch a pattern of openings into the oxide layer using $SF_6$. The finish on the surface of an opening through silicon oxide is important, as this affects the ability of the conductive coating applied to form a continuous (pinhole-free) layer and to bond well to the silicon oxide surface. Preferably, the silicon oxide has a peak-to-peak surface roughness that is less than about 2 $\mu$m.

During deposition of a metal coating on the interior surfaces of the through-hole, the glass layer containing the through-hole may be rotated to obtain a uniform metal coating on the inside surface of the through-hole. The coating is applied not only to the interior of the through-hole, but is also extended onto each surface of a glass plate in the area surrounding the through-hole. The thickness of the conductive coating on the surface of the glass plate should be less than about 300 nm when the glass plate is to be anodically bonded to a silicon plate. The minimum conductive coating thickness required depends on the roughness of the interior surface of the through-hole. In general, when the through-hole surface is relatively rough, a thicker conductive coating is needed than when the through-hole has a smoother interior surface. For example, when the surface roughness of the through-hole is about 200 nm, a conductive coating having a minimum thickness of 200 nm should be applied; when the surface roughness is about 50 nm, a minimum conductive coating thickness of 50 nm should be applied.

In one embodiment of the invention, the glass layer is attached to, preferably bonded to, a semiconductor layer prior to application of the conductive material to the through-hole surface. In this embodiment, one end of the through-hole, which is covered by the semiconductor layer, is also coated with the conductive material. Subsequent to deposition of the metal coating on the interior surfaces of the glass layer through-hole, with preferable simultaneous deposition on the surface of a semiconductor material covering one end of the glass through-hole, the glass layer is anodically bonded to at least one conductive layer or to a semiconductor layer.

The present invention avoids the requirement of a pyramidal structure by implementation of robust electrical feedthroughs within a multilayered substrate which can be diced to provide desired device structures.

Accordingly, disclosed herein is a method of preparing a vertical, electrically connected substrate structure. The method includes the steps of: a) providing a second substrate overlying a first substrate, wherein the first substrate and the second substrate comprise materials having similar coefficients of expansion, and wherein the second substrate has at least one through-hole formed therein; b) anodically bonding the first substrate to the a first surface of the second substrate; c) simultaneously depositing a layer of a conductive material over an interior surface of the at least one through-hole, an upper portion of the first substrate exposed in the area of the through-hole, and over a portion of a second surface of the second substrate surrounding the through-hole, thereby forming a conductive pad surrounding the through-hole; and d) anodically bonding a third substrate to the second surface of the second substrate, wherein the second substrate and the third substrate comprise materials having similar coefficients of expansion, whereby the first substrate is electrically connected to the third substrate by means of the conductive material layer.

Another embodiment, in which a glass layer is sandwiched between two semiconductor layers and it is desired to use a thick conductive coating which would interfere with anodic bonding of the glass to semiconductor surfaces, is described below. In this embodiment, the glass layer may extend beyond the semiconductor layers to which it is bonded, such that the opening in the glass layer extends beyond the opening in the semiconductor layer. This enables the application of a thick conductive coating on the surface of the glass opening without affecting anodic bonding between the glass and semiconductor layers.

Also disclosed herein is a second embodiment method of preparing a vertical, electrically connected substrate structure, comprising the following steps: a) providing a second substrate overlying a first substrate, wherein the first substrate and the second substrate comprise materials having similar coefficients of expansion, wherein the first substrate has at least one through-hole formed therein, and the second substrate has at least one through-hole formed therein, wherein a diameter of the first substrate through-hole is larger than a diameter of the second substrate through-hole, and wherein the first substrate through-hole is in communication with the second substrate through-hole; b) anodically bonding the first substrate to the second substrate; c) depositing a first layer of a conductive material over an interior surface of the second substrate through-hole and over a portion of an upper surface of the second substrate; d) depositing a second layer of the conductive material over an interior surface of the second substrate through-hole and over a portion of an upper surface of the second substrate, wherein the upper surface portion which is covered by the second conductive material layer is less than the upper surface portion which is covered by the first conductive material layer; and e) depositing a third layer of the conductive material over an interior surface of the first substrate through-hole, an interior surface of the second substrate through-hole, and over a portion of a lower surface of the second substrate. This embodiment of the invention is particularly useful when a conductive material coating having a thickness greater than 300 nm is required.

The above method can be used to prepare basic "units" which can be stacked and anodically bonded together to form an electrically connected, multi-unit substrate structure. In this case, the above method further includes the following steps: f) providing a second substrate structure which has the same structure as the first substrate structure, and is formed by the same process as the first substrate structure; g) aligning the second substrate structure with the first substrate structure such that the first substrate of the second substrate structure is in contact with the second substrate of the first substrate structure; and h) anodically bonding the second substrate structure to the first substrate structure, whereby the first substrate structure is electrically connected to the second substrate structure by means of the conductive material layers, and whereby all substrates in the first and second substrate structures are electrically connected.

An alternative embodiment of the above method includes only two conductive material layer deposition steps (i.e., the step d) conductive material layer deposition step of the above embodiment is omitted). This embodiment comprises the following steps: a) providing a second substrate overlying a first substrate, wherein the first substrate and the second substrate comprise materials having similar coefficients of expansion, wherein the first substrate has at least one through-hole formed therein, and the second substrate has at least one through-hole formed therein, wherein a diameter of the first substrate through-hole is larger than a diameter of the second substrate through-hole, and wherein the first substrate through-hole is in communication with the second substrate through-hole; b) anodically bonding the first substrate to the second substrate to form a first substrate structure; c) depositing a first layer of a conductive material over an interior surface of the second substrate through-hole and over a portion of an upper surface of the second substrate; and d) depositing a second layer of the conductive material over an interior surface of the first substrate through-hole, an interior surface of the second substrate through-hole, and over a portion of a lower surface of the second substrate. This embodiment is particularly useful for use with glass through-holes having an aspect ratio of 2:1 or less. As used herein, the term "aspect ratio" refers to the ratio of the thickness of the glass layer (i.e., the "height" of the through-hole) to the diameter of the through-hole. If the aspect ratio of the through-hole is too high, it may be difficult to entirely coat the surface of the through-hole with metal.

The above method can also be used to prepare basic "units" which can be stacked and anodically bonded together to form an electrically connected, multi-unit substrate structure. In this case, the above method further includes the following steps: e) providing a second substrate structure which has the same structure as the first substrate structure, and is formed by the same process as the first substrate structure; f) aligning the second substrate structure with the first substrate structure such that the first substrate of the second substrate structure is in contact with the second substrate of the first substrate structure; and g) anodically bonding the second substrate structure to the first substrate structure, whereby the first substrate structure is electrically connected to the second substrate structure by means of the conductive material layers, and whereby all substrates in the first and second substrate structures are electrically connected.

Another embodiment of the method of the invention for preparing a vertical, electrically connected substrate structure includes the following steps: a) providing a second substrate sandwiched between a first substrate and a third substrate, wherein the first substrate, the second substrate, and the third substrate comprise materials having similar coefficients of expansion, wherein the first substrate, the second substrate, and the third substrate each has at least one through-hole formed therein, and wherein a diameter of the first substrate through-hole and a diameter of the third substrate through-hole are larger than a diameter of the second substrate through-hole, and wherein the first substrate through-hole is in communication with the second substrate through-hole, and the second substrate through-hole is in communication with the third substrate through-hole; b) anodically bonding the second substrate to the first substrate and the third substrate; c) depositing a first layer of a conductive material over an interior surface of the third substrate through-hole, a portion of an upper surface of the second substrate, and an interior surface of the second substrate; and d) depositing a second layer of a conductive material over an interior surface of the first substrate through-hole, a portion of a lower surface of the second substrate, and an interior surface of the second substrate through-hole.

Yet another embodiment of the method of the invention comprises the following steps: a) providing a first substrate, wherein the first substrate has at least one through-hole formed therein; b) depositing a first layer of a conductive material over a portion of an upper surface of the first substrate and over an interior surface of the first substrate through-hole; c) depositing a second layer of a conductive material over a portion of an upper surface of the first substrate and over an interior surface of the first substrate through-hole, wherein the upper surface portion which is covered by the second conductive material layer is less than the upper surface portion which is covered by the first conductive material layer; d) depositing a third layer of a conductive material over a portion of a lower surface of the first substrate and over an interior surface of the first substrate through-hole; and e) depositing a fourth layer of a conductive material over a portion of a lower surface of the first substrate and over an interior surface of the first substrate through-hole, wherein the lower surface portion which is covered by the fourth conductive material layer is less than the upper surface portion which is covered by the third conductive material layer. Preferably, the first substrate is then sandwiched between and anodically bonded to a second substrate and a third substrate, where the second substrate and the third substrate comprise materials having a similar coefficient of expansion as the first substrate.

Another method of preparing a vertical, electrically connected substrate structure comprises the steps of: a) providing a second substrate overlying a first substrate, wherein the first substrate and the second substrate comprise materials having similar coefficients of expansion, wherein the first substrate has at least one through-hole formed therein, and the second substrate has at least one through-hole formed therein, wherein a diameter of the first substrate through-hole is smaller than a diameter of the second substrate through-hole, and wherein the first substrate through-hole is in communication with the second substrate through-hole; b) anodically bonding the first substrate to the second substrate; and c) depositing a first layer of a conductive material over a portion of an upper surface of the second substrate, an interior surface of the second substrate through-hole, a portion of an upper surface of the first substrate, and an interior surface of the first substrate through-hole. The above method can also be used to prepare basic "units" which can be stacked and anodically bonded together to form an electrically connected, multi-unit substrate structure, as described above.

BRIEF DESCRIPTION OF THE DRAWINGS

The foregoing and other aspects of the invention will be appreciated from the following detailed discussion, provided in conjunction with the accompanying drawings, in which:

FIG. 2A shows a schematic of a cross-section of a structure 200 of a silicon wafer 204 bonded to a glass layer 202. Preferably, silicon wafer 204 is anodically bonded to glass layer 202. Glass layer 202 has through-holes 208 which are covered at one end by silicon wafer 204.

FIG. 2B shows the structure of FIG. 2A after an electrically conductive material is applied to form a coating 210 over the interior surface 209 of through-hole 208 and over the exposed surface 207 of silicon wafer 204.

FIG. 2C shows the structure of FIG. 2B after anodic bonding of that structure to a second silicon wafer 216.

FIG. 3A shows a top view (from the silicon side) of a previously diced, 6 mm×6 mm chip 300 which comprises a silicon layer 302 anodically bonded to a glass plate 320. Prior to anodic bonding, silicon layer 302 was chemically etched and/or micromachined to produce various openings 308 and through-holes 304, as well as gaps 306, so that block vias could be formed.

FIG. 3B shows a bottom view (from the glass side) of the structure 300 shown in FIG. 3B. The glass structure 320 was a micromachined glass plate which included a glass surface 322 and through-holes 324 having interior surfaces 326 to which an aluminum coating has been applied.

FIG. 3C shows a three-dimensional top view of alternating silicon layers 302 and glass layers 320 which have been stacked to form multi-layered substrate structure 330.

FIG. 3D shows a three-dimensional side view of the multi-layered structure 330 shown in FIG. 3C, which has been anodically bonded by means of bonding block 342. The multilayered structure 330 includes block vias 303 which provide vertical electrical interconnects between various layers of the multi-layered structure.

FIG. 4A shows a schematic of a cross-section of a structure 400 of a silicon wafer 402 bonded to a glass layer 404. Preferably, silicon wafer 402 is anodically bonded to glass layer 404. Both silicon wafer 402 and glass layer 404 have through-holes (403, 405, respectively) formed therein. The diameter A of through-hole 403 formed in silicon wafer 402 is larger than the diameter B of through-hole 405 formed in glass layer 404. Positioned above glass layer 404 is a shadow mask 406 having an opening size C.

FIG. 4B shows the structure 400 of FIG. 4A after a first layer of an electrically conductive material is applied to form a coating 408 over the interior surface of through-hole 405 and over an exposed portion of an upper surface of glass layer 404.

FIG. 4C shows the structure 400 of FIG. 4B after a second layer of an electrically conductive material is applied to form a coating 412 over the interior surface of through-hole 405 and over an exposed portion of an upper surface of glass layer 404. The second conductive material layer 412 is deposited through a second shadow mask 410 which has an opening size D which is smaller than the opening size C of the first shadow mask 406 which was used during the deposition of first conductive material layer 408. As a result, the upper surface portion of glass layer 404 which is covered by second conductive material layer 412 is less than the upper surface portion of glass layer 404 which is covered by first conductive material layer 408.

FIG. 4D shows the structure 400 of FIG. 4C after a third layer of an electrically conductive material is applied to form a coating 416 over the interior surface of through-hole 405, the interior surface of through-hole 403, and over an exposed portion of a lower surface of glass layer 404. The third conductive material layer 416 is deposited through a third shadow mask 414 which has an opening size E which is roughly equivalent to the opening size D of the second shadow mask 410 which was used during the deposition of second conductive material layer 412.

FIG. 4E shows the final substrate structure 420 after removal of third shadow mask 414.

FIG. 5A shows a schematic of a cross-section of a structure 500 of a silicon wafer 502 bonded to a glass layer 504. Preferably, silicon wafer 502 is anodically bonded to glass layer 504. Both silicon wafer 502 and glass layer 504 have through-holes (503, 505, respectively) formed therein. The diameter A of through-hole 503 formed in silicon wafer 502 is larger than the diameter B of through-hole 505 formed in glass layer 504. Positioned above glass layer 504 is a shadow mask 506 having an opening size C.

FIG. 5B shows the structure 500 of FIG. 5A after a first layer of an electrically conductive material is applied to form a coating 508 over the interior surface of through-hole 505 and over an exposed portion of an upper surface of glass layer 504.

FIG. 5C shows the structure 500 of FIG. 5B after a second layer of an electrically conductive material is applied to form a coating 512 over the interior surface of through-hole 505, the interior surface of through-hole 503, and over an exposed portion of a lower surface of glass layer 504. The second conductive material layer 512 is deposited through a second shadow mask 510 which has an opening size D which is smaller than the opening size C of the first shadow mask 506 which was used during the deposition of first conductive material layer 508.

FIG. 5D shows the final substrate structure 520 after removal of second shadow mask 510.

FIG. 5E illustrates the first substrate structure 520 of FIG. 5D together with a second substrate structure 540, prior to alignment of and anodic bonding of second substrate structure 540 to first substrate structure 520. Second substrate structure 540 has the same structure as first substrate structure 520.

FIG. 5F shows a multi-unit structure 560 following alignment and anodic bonding of second substrate structure 540 to first substrate structure 520.

FIG. 6A shows a schematic of a cross-section of a structure 600 of a glass layer sandwiched between and bonded to each of two silicon wafers 602, 606. Preferably, silicon wafers 602 and 606 are anodically bonded to glass layer 604. Silicon wafers 602 and 606 and glass layer 604 have through-holes formed therein. The diameter $A_1$ of through-hole 603 formed in silicon wafer 602 and the diameter $A_2$ of through-hole 607 formed in silicon wafer 606 are both larger than the diameter B of through-hole 605 formed in glass layer 604.

FIG. 6B shows the structure 600 of FIG. 6A with a first shadow mask 608 having an opening size C positioned above silicon layer 606. A first layer of an electrically conductive material has been applied to form a coating 610 over the interior surface of through-holes 607 and 605 and over an exposed portion of an upper surface of glass layer 604.

FIG. 6C shows the structure 600 of FIG. 6B with a second shadow mask 612 having an opening size D positioned above silicon layer 602. A second layer of an electrically conductive material has been applied to form a coating 614 over the interior surface of through-holes 603 and 605, and over an exposed portion of a lower surface of glass layer 604.

FIG. 7A shows a schematic of a cross-section of a starting structure 700 consisting of a glass layer 702 with a through-hole having a diameter A formed therein. Positioned above an upper surface of glass layer 702 is a shadow mask 704 having an opening size B.

FIG. 7B shows the structure 700 of FIG. 7A after a first layer of a conductive material has been applied to form a coating 706 over a portion of an upper 21 surface of glass layer 702, and over an interior surface of through-hole 703.

FIG. 7C shows the structure 700 of FIG. 7B after removal of first shadow mask 704. A second shadow mask 708 has been positioned above the upper surface of glass layer 702. A second conductive material layer has been deposited to form a coating 710 over an upper surface of glass layer 702, and over an interior surface of through-hole 703. The upper surface portion of glass layer 702 which is covered by second conductive material layer 710 is less than the upper surface portion of glass layer 702 which is covered by first conductive material layer 706.

FIG. 7D shows the structure 700 of FIG. 7C after removal of second shadow mask 708. A third shadow mask 712 has been positioned above a lower surface of glass layer 702. A third conductive material layer has been deposited to form a coating 714 over a portion of a lower surface of glass layer 702 and over an interior surface of through-hole 703.

FIG. 7E shows the structure 700 of FIG. 7D after removal of third shadow mask 712. A fourth shadow mask 716 has been positioned above the lower surface of glass layer 702. A fourth conductive material layer has been deposited to form a coating 718 over a portion of a lower surface of glass layer 702 and over an interior surface of through-hole 703. The lower surface portion of glass layer 702 which is covered by fourth conductive material layer 718 is less than the lower surface portion of glass layer 702 which is covered by third conductive material layer 714.

FIG. 7F shows the structure 700 of FIG. 7E after the removal of fourth shadow mask 718.

FIG. 7G shows the final structure 730 which is formed by sandwiching glass layer 702 between silicon layers 720 and 722. Glass layer 702 is preferably anodically bonded to silicon layers 720 and 722. Silicon layers 720 and 722 are electrically connected by means of conductive material layers 706, 710, 714, and 718.

FIG. 8A shows a schematic of a cross-section of a structure 800 of a silicon wafer 802 bonded to a glass layer 804. Preferably, silicon wafer 802 is anodically bonded to glass layer 804. Both silicon wafer 802 and glass layer 804 have through-holes (803, 805, respectively) formed therein. The diameter A of through-hole 803 formed in silicon wafer 802 is larger than the diameter B of through-hole 805 formed in glass layer 804. Positioned above glass layer 804 is a shadow mask 806 having an opening size C.

FIG. 8B shows the structure 800 of FIG. 8A after a first layer of an electrically conductive material is applied to form a coating 808 over the interior surface of through-hole 805 and over an exposed portion of an upper surface of glass layer 804.

FIG. 8C shows the structure 800 of FIG. 8B after a second layer of an electrically conductive material is applied to form a coating 812 over the interior surface of through-hole 805, the interior surface of through-hole 803, and over an exposed portion of a lower surface of glass layer 804. The second conductive material layer 812 is deposited through a second shadow mask 810 which has an opening size D which is smaller than the opening size C of the first shadow mask 806 which was used during the deposition of first conductive material layer 508.

DETAILED DESCRIPTION OF PREFERRED EMBODIMENTS

Figure 1A:
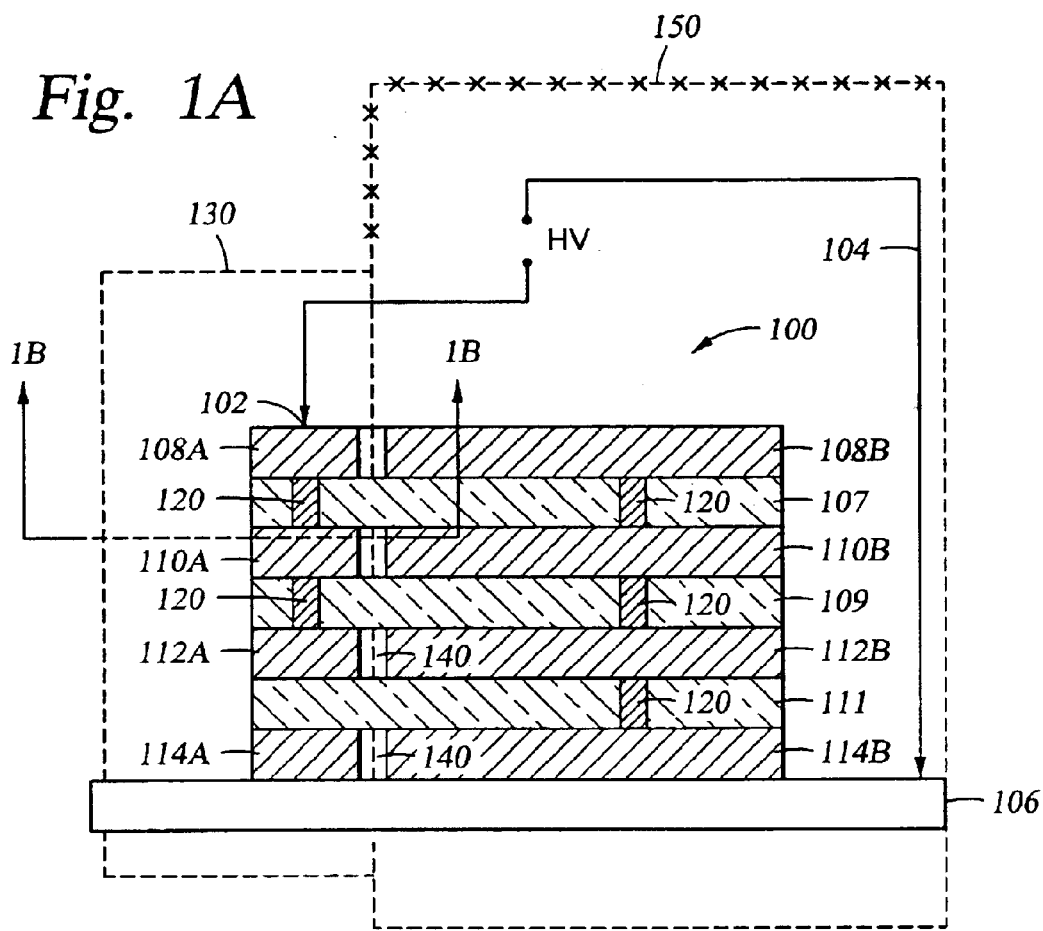
FIG. 1A shows a schematic of a cross-section of a stack of layers bonded using an anodic bonding technique useful in the present invention.

As a preface to the detailed description, it should be noted that, as used in this specification and the appended claims, the singular forms of "a", "an", and "the" include plural referents, unless the context clearly dictates otherwise. Thus, for example, the term "a semiconductor" includes a variety of different materials which are known to have the behavioral characteristics of a semiconductor; reference to "a metal" includes, for example, aluminum, aluminum alloys, chromium, chromium/gold, tungsten, tungsten alloys, iridium, iridium alloys, platinum, platinum alloys, and other conductive materials which would be suitable in the application described. Although copper may be used to form a conductive coating according to the present invention, the anodic bonding process must be performed under vacuum because of the tendency of copper to oxidize.

The method of the invention is generally applicable to the bonding of any two layers where an electrochemical cell can be formed between the two layers. Although the invention is described with respect to the bonding of a glass layer to a conductive layer, one skilled in the art, after reading this disclosure, will understand that other dielectric second materials (other than a glass as it is commonly defined) may be substituted for glass, so long as the dielectric second material is capable of performing the function necessary to permit anodic bonding. The second material should provide the effective formation of an electrochemical cell during the bonding process. Borosilicate glass is known to be well-suited for this purpose, because it contains charge transfer ions which facilitate the formation of electrochemical cells and enable the anodic bonding process. In the following example descriptions, "glass" is referred to generically and may be selected from any one of a number of different kinds of glass known in the art, or for that matter, different kinds of glass which may be developed in the future. However, it is within the contemplation of the invention that other suitable materials capable of enabling the formation of electrochemical cells, including materials which may be devised in the future, may substitute for glass.

In addition, while silicon has been mentioned as the material involved in one of the anodically bonded layers, this silicon may have only sufficient impurities or doping to permit adequate charge transfer or may be highly doped. Other conductive materials, including but not limited to other semiconductor materials, or metals, may be used, as previously mentioned herein. Clearly, the number of layers to be anodically bonded may vary as desired. Moreover, while more silicon layers than glass layers are depicted in the following examples, once again the invention is not so limited. Interleaving of layers of different materials per se is what is important.

U.S. patent application Ser. No. 09/739,078 (the '078 application), of Harald S. Gross, filed Dec. 13, 2000, assigned to the Assignee of the present invention, and hereby incorporated by reference in its entirety, describes a method for anodic bonding of a stack of conductive and glass layers. The anodic bonding method described by Harald Gross in the '078 application is particularly useful in the present invention. In the '078 application, Harald Gross disclosed that, during the anodic bonding of a glass layer to a conductive layer, undesirable sodium compounds form on a glass surface which is in contact with a surface acting as a negative electrode. The extent of this compound formation is so pervasive as to cause major bonding problems, and to even prevent bonding in some instances. To prevent the formation of such compounds, it is helpful to follow the instructions provided in the '078 application during anodic bonding of the glass to conductive layers (typically silicon layers) when forming the structures described herein. As described in the '078 application, in the anodic bonding process where DC potential is applied, bonding is typically achieved for a multilayered stack of glass and conductive layers in two steps. Depending on the design layout of the glass layer conductive through-holes, some of the bonding between silicon layer surfaces and glass layer surfaces may be carried out in a first step, followed by reversal of the DC potential to bond other silicon layer surfaces to other glass layer surfaces.

Due to the extensive and pervasive sodium compounds formed during the anodic bonding process, it is advisable that the multilayered structure provide for the concentration of sodium compounds which are formed in the anodic bonding process in an area of the bonding structure which is away from critical bonding surfaces. Preferably, the sodium compounds are concentrated at a location within the bonding structure which can be removed from the bonded structure, or where the compounds can be cleaned from the glass surface.

Figure 1B:
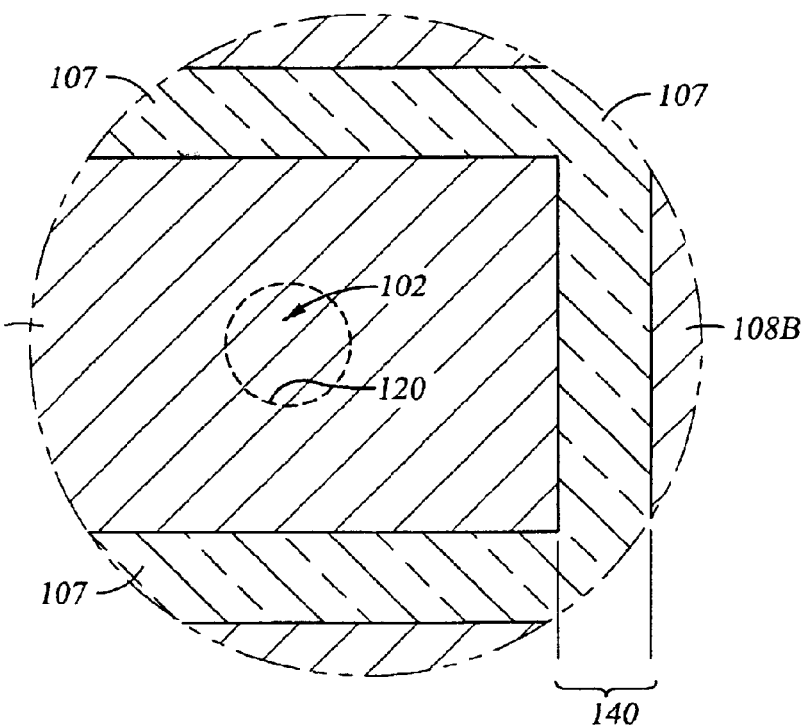
FIG. 1B shows a schematic of an enlarged top view of a portion of the upper surface of the stack of layers shown in FIG. 1A, to better illustrate a block via.

FIGS. 1A and 1B illustrate one of the anodic bonding method embodiments described in the '078 application. The method of anodic bonding shown in FIGS. 1A and 1B is typically used in circumstances in which it is difficult to contact all of the layers to be bonded separately. As shown in FIG. 1A, gaps 140 are formed in the silicon layer portions 108A, 110A, 112A, and 114A. As illustrated in FIG. 1B, with respect to the upper silicon layer 108, gaps 140 are used to separate silicon layer 108 into silicon layer portions 108A and 108B. Electrical feedthroughs 120 are provided through glass layers 107, 109, and 111, as shown; these glass layers are continuous and do not include gaps. As illustrated by the combination of FIGS. 1A and 1B, the provision of gaps 140 in portions of silicon layer 108 and in underlying silicon layers 110, 112, and 114, produces silicon layer portions 108A, 110A, 112A, and 114A, which create a "block via" 130. By contacting an electrode 102 to the uppermost silicon layer portion 108A of the block via 130, it is possible to contact all of the glass layers 107, 109, and 111. In this fashion, the block via 130 acts as an electrical feedthrough inside the stack 100. The block via 130 should be separated from the rest of the silicon-glass structure due to the presence of sodium compounds which accumulate there. Thus, this block via 130 is designed to be removed from or to have no function in the stack 100 other than to provide for electrode contact.

The block via 130 enables contact to all of the glass layers at once. As illustrated, all of the silicon layer portions are electrically connected by means of the electrical feedthroughs 120 to the bottom of the stack 100 which is sitting on hotplate 106. In this fashion, parallel connection of the electrochemical cells is accomplished when the DC voltage is applied. Using the anodic bonding technique shown in FIG. 1A, formation of sodium compounds will occur at the layer interfaces of the block via 130 portion of stack 100, which is outside of the device stack 150. In the case where the device stack 150 is used in an electron optics microcolumn, for example, this sodium compound formation will not have an adverse effect on the function of the microcolumn.

Figure 2A:
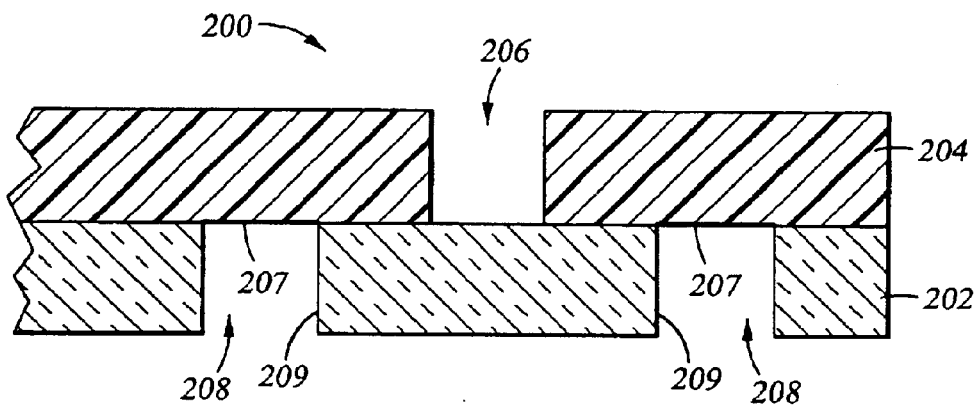
FIGS. 2A through 2C show a series of structures illustrating a first embodiment of the invention which pertains to a structure which includes at least one layer of glass which is anodically bonded to layers of conductive and/or semiconductive material.
Figure 2B:
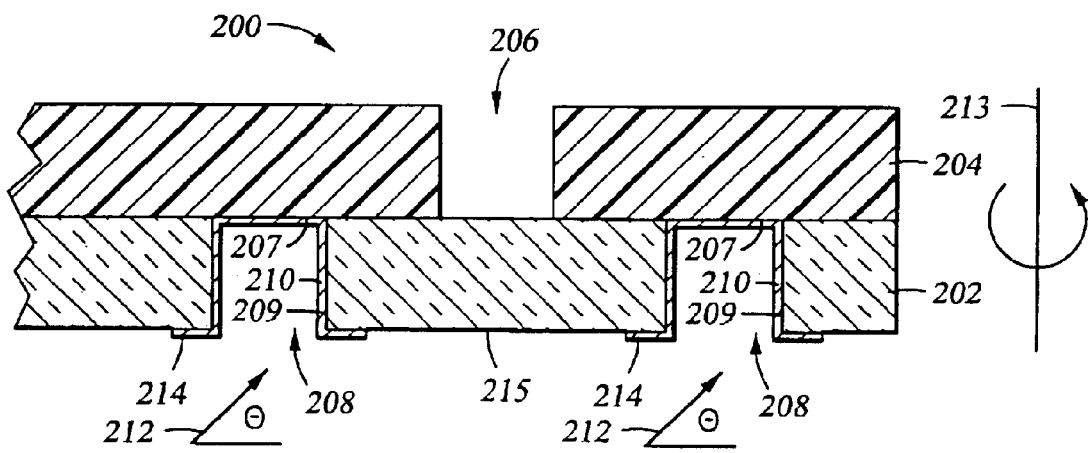
Figure 2C:
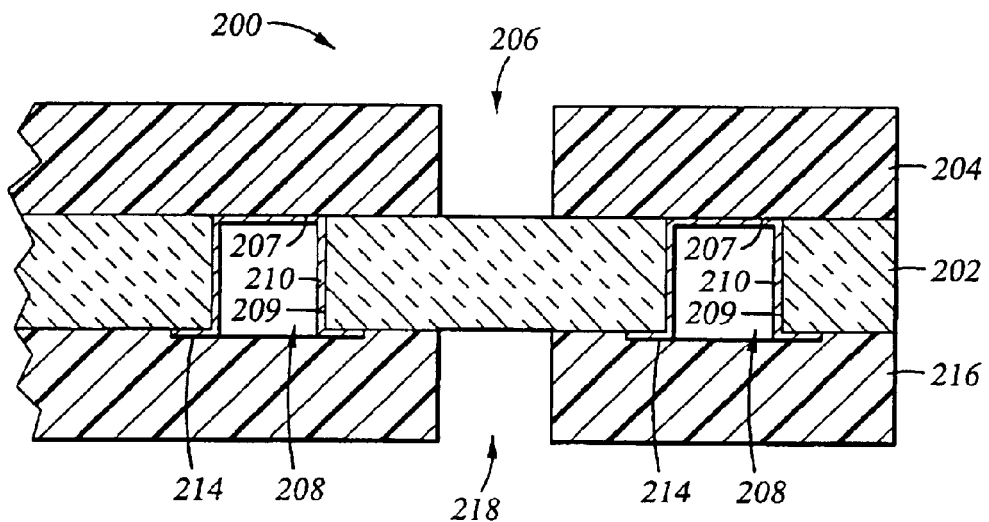

FIGS. 2A through 2C show a series of process steps in which "building block structures" which can be used to form a multilayered structure are fabricated. These process steps particularly illustrate a preferred method of preparing electrically conductive through-holes within glass layers of a multilayered structure. Several of the "building block" structures can be anodically bonded to each other to form the multilayered structure.

FIG. 2A shows a schematic of a cross-sectional view of a glass layer 202 which has been anodically bonded to a silicon layer 204. Anodic bonding of glass layer 202 and silicon layer 204 was performed as described above, at a voltage of 500 V, at a temperature of about 400° C., for a period of 5 minutes. Anodic bonding is typically performed at a voltage within the range of about 200 V to about 2 kV, for a period of about 1 minute to about 100 minutes. If glass layer 202 is a borosilicate glass, such as PYREX® or BOROFLOAT® (available from Schott Glass Technologies, New York, N.Y.), the temperature during the anodic bonding process is typically within the range of about 300° C. to about 500° C. If glass layer 202 is a lithium aluminosilicate-β-quartz glass ceramic, such as Prototype PS-100 (available from HOYA Co., Tokyo, Japan), the temperature during the anodic bonding process is typically within the range of about 140° C. to about 180° C.

Factors which must be considered in determining the amount of time which will be required for bonding include, but are not limited to, the applied voltage, the temperature of the substrate, the surface area of the contact electrode, the glass surface area to be bonded in combination with the geometry of the glass electrical contact surface area, and the distance ions must travel to promote the bonding. In general, the higher the voltage and temperature, the shorter the time period of voltage application needed to achieve anodic bonding.

Glass layer 202 typically has a thickness within the range of about 200 $\mu$m to about 2 mm. In the example illustrated in FIG. 2A, glass layer 202 had a thickness of 250 $\mu$m. Silicon layer 204 typically has a thickness within the range of about 100 $\mu$m to about 800 $\mu$m. In the example illustrated in FIG. 2A, silicon layer 204 had thickness of 800 $\mu$m. Silicon layer 204 may include gaps 206 which permit the formation of block vias of the kind described with reference to FIGS. 1A and 1B.

Glass layer 202 includes through-holes 208 for the purpose of making electrical connections with silicon layer 204. The through-holes 208 may be ultrasonically drilled, wet chemically etched, or laser drilled (for example and not by way of limitation) in glass layer 202. The finish on the surface of the through-hole is important, as this affects the ability to form a continuous conductive coating over the surface of the through-hole. For example, if the surface of the through-hole is rough, a thicker conductive coating is needed in order to form a continuous coating over all the hills and valleys on the through-hole surface. On the other hand, if the surface of the through-hole is very smooth, a thinner conductive coating can be applied.

For optimum results, the surface roughness of the through-hole should be no greater than about 500 nm; even more preferably, the surface roughness should be no greater than about 200 nm. If the surface of the through-hole has a roughness within the range of about 200 nm to about 500 nm, the conductive coating is typically applied using evaporation. If the roughness of the through-hole surface is less than about 200 nm, sputter deposition (i.e., PVD) techniques can be used as an alternative to evaporation to deposit the conductive coating.

Laser drilling using a pulsed laser with a femtosecond ($10^{-5}$ sec) laser pulse has been shown to provide a very smooth finish (<100 nm surface roughness) on the surface of the through-hole. If a different method (such as ultrasonic drilling) is used which provides a relatively rough (>500 nm surface roughness) finish on the surface of the through-hole, the surface can be smoothed by first dipping the glass plate 202 in hot water (having a temperature significantly less than 100° C.) to fill any microcracks present in the glass. This step is followed by immersion of the glass plate in buffered HF (typically, at a concentration of about 10 volume % HF) in an ultrasonic bath at room temperature for about 5 minutes, to smooth the rough surfaces of the through-hole.

Referring to FIG. 2B, the interior surface 209 of through-hole 208 and the exposed surface 207 of silicon layer 204 were coated with a layer of a conductive material to form a conductive coating 210 on the interior surface 209 of the through-hole 208 and a conductive pad 204 on the surface 215 of glass layer 202 which is not attached to silicon layer 204. The conductive material deposited in the example illustrated in FIG. 2B was aluminum; however, other metals can be used to form the electrical contacts which electrically connect the glass and silicon layers to each other. The conductive material is preferably a metal that will oxidize, including but not limited to aluminum, titanium, chromium, and chromium with an overlying layer of gold (where the chromium and gold are present in a thickness ratio of approximately 1:1). Because silicon forms a native oxide, there is typically a very thin layer of silicon oxide at the surface of the silicon wafer. Metals such as aluminum will react with the oxygen in the silicon oxide to form a metal oxide (e.g., aluminum oxide). This also allows the silicon to diffuse into the conductive layer and the aluminum spikes into the gaps left by the diffused silicon, forming an ohmic contact during anodic bonding. In the case of chromium/gold, the gold will almost completely diffuse into the silicon. However, the gold will serve as a protective coating for the chromium in areas where the chromium/gold is not in contact with silicon.

The conductive material can be deposited using techniques known in the art, such as evaporation, sputtering, or electroplating, for example and not by way of limitation. Deposition of the conductive material using evaporated metal or sputtered metal is recommended, since the coating 210 produced is a high purity coating. Evaporated aluminum is typically applied, as illustrated by arrow 212 in FIG. 2B, through a shadow mask (not shown) at an angle θ ranging from about 30° to about 60° into through-holes 208.

The thickness of the conductive material coating 214 is typically within the range of about 100 nm to about 300 nm. The minimum conductive coating thickness required depends on the roughness of the interior surface of the through-hole. In general, when the through-hole 208 surface is relatively rough, a thicker conductive coating 214 is needed than when the through-hole has a smoother interior surface. For example, when the surface roughness of the through-hole 208 is about 200 nm, a conductive coating 214 having a minimum thickness of 200 nm should be applied; when the surface roughness is about 50 nm, a minimum conductive coating thickness of 50 nm should be applied.

Anodic bonding creates an electrostatic force between the silicon and glass layers. If conductive pad 214 is too thick (greater than about 300 nm thickness), this may create stress on glass layer 202 and/or a subsequently applied silicon layer, which may affect the strength of anodic bonding between the glass and silicon layers.

If the conductive coating thickness required is greater than about 200 nm, the conductive coating 214 is typically applied using evaporation. If the roughness of the through-hole 208 surface is less than about 200 nm, sputter deposition (i.e., PVD) techniques can be used to deposit the conductive coating.

The two-layered structure shown in FIG. 2B was then anodically bonded to another silicon layer 216. Anodic bonding was performed as described above. Again, silicon layer 216 may have a gap 218 present so that a block via of the kind shown in FIGS. 1A and 1B may be formed. Anodic bonding creates an electrostatic force between the silicon and glass layers. In addition, the anodic bonding is carried out at elevated temperatures which allow the formation of an alloy between silicon layer 216 and the metal pad 214, so that contact resistance is reduced. When the metal is aluminum, a bonding temperature in the range of about 450° C. permits alloy formation and reduces the resistance through the metal contact by more than two orders of magnitude.

The silicon-glass-silicon sandwich structure can now be diced into individual chips of the desired size and shape.

Figure 3A:
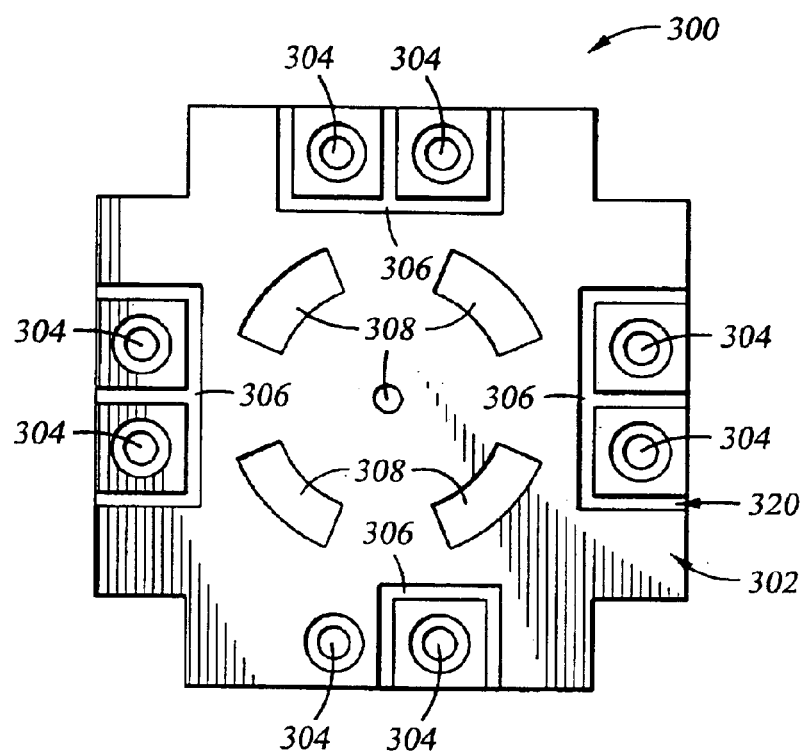
FIGS. 3A through 3D show a schematic top view of individual layers and three-dimensional views of a multilayered structure made up from the individual layers. The multilayered structure is made up from a number of alternating glass and silicon layers, where the glass layers are anodically bonded to layers of silicon, and where the glass layers act as a spacer, electrical isolator, and soldering material between the silicon layers. At least a portion of the glass layers include at least one through-hole, the interior surface of which is coated with a conductive material. The multilayered structure includes a number of block vias.

FIG. 3A shows a top view (from the silicon side) of a previously diced, 6 mm×6 mm chip 300 which comprises a silicon layer 302 anodically bonded to a glass plate 320. Prior to anodic bonding, silicon layer 302 was chemically etched and/or micromachined to produce various openings 308 and through-holes 304, as well as gaps 306, so that block vias could be formed. The result was structure 300, which was designed for use in a MEMS device. For example-(and not by way of limitation), a structure such as that shown in FIG. 3B could be used in a MEMS device for biomedical applications.

Figure 3B:
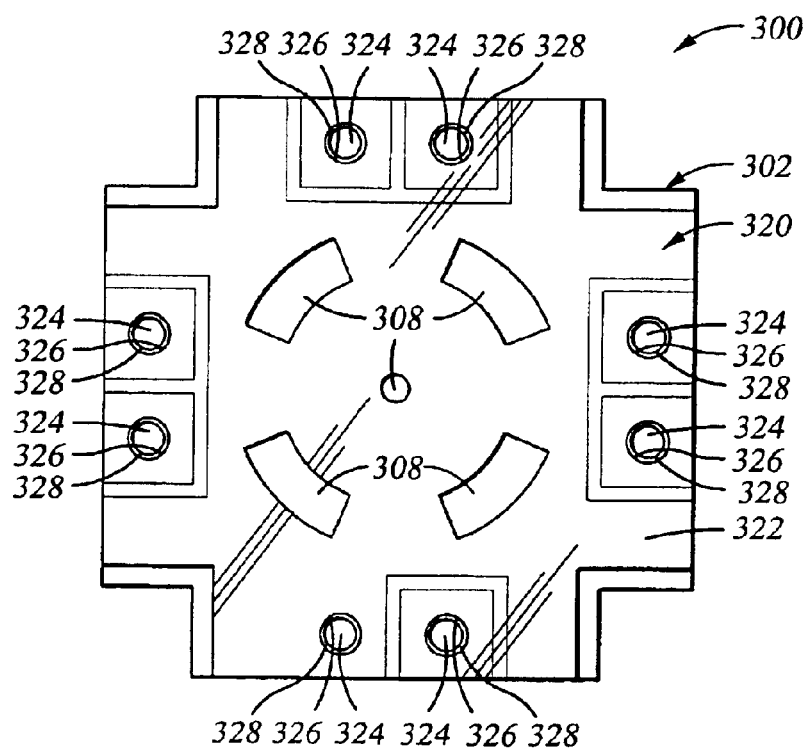

FIG. 3B shows a bottom view (from the glass side) of the structure 300 shown in FIG. 3B. The glass structure 320 was a micromachined glass plate which included a glass surface 322 and through-holes 324 having interior surfaces 326 to which an aluminum coating has been applied. The aluminum was applied to the through-holes 324 in glass structure 320 in the manner described above with reference to FIGS. 2A through 2C.

Figure 3C:
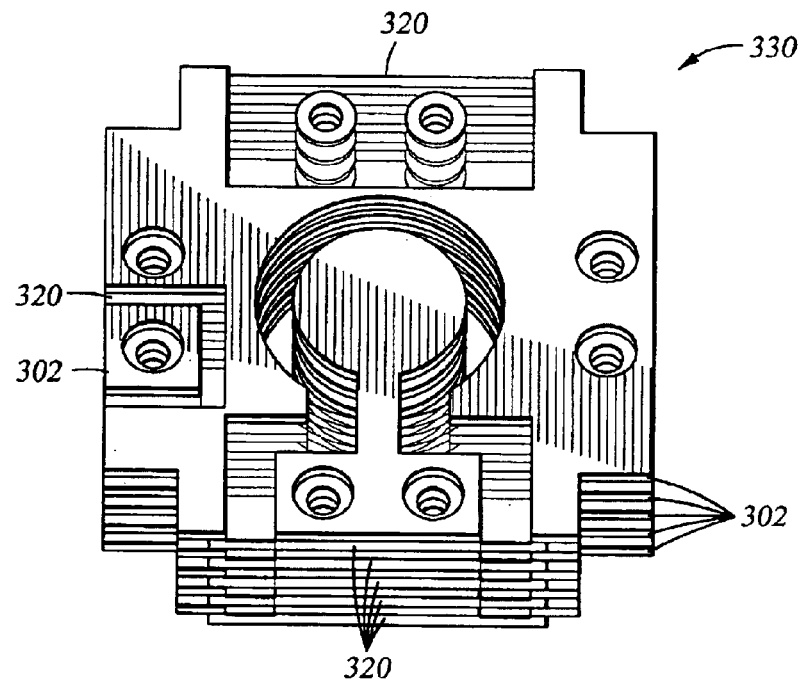

FIG. 3C shows a three-dimensional top view of alternating silicon layers 302 and glass layers 320 which have been stacked to form multi-layered substrate structure 330.

Figure 3D:
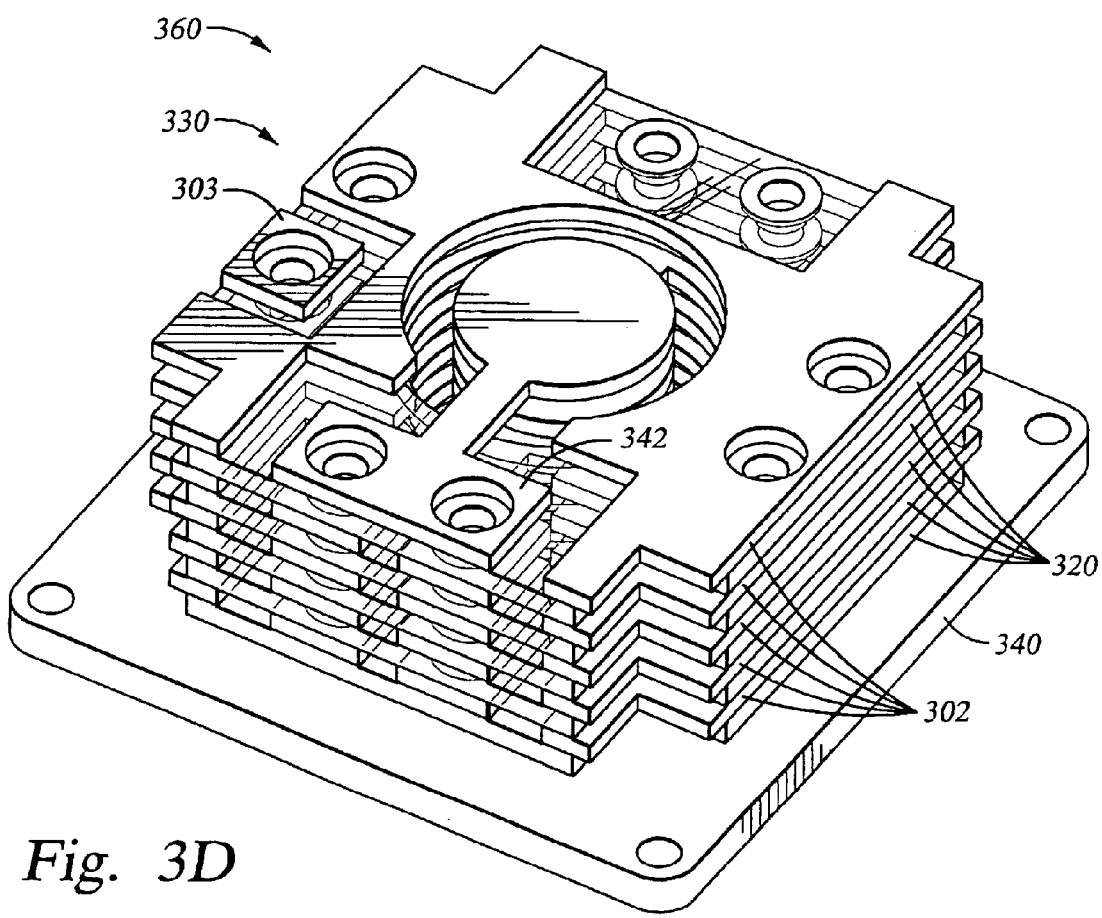

FIG. 3D shows a three-dimensional side view of the multi-layered structure 330 shown in FIG. 3C, which has been anodically bonded by means of bonding block 342. Anodic bonding was performed at a voltage of 500 V, at a temperature of about 400° C., for a period of 5 minutes. This multilayered structure 330 includes block vias 303 which provide vertical electrical interconnects between various layers of the multilayered structure. The glass layers 320 act as spacers, electrical isolators, and soldering materials between the conductive or semiconductive layers 302 of structure 330. Structure 330 has been bonded to base plate 340.

Figure 3E:
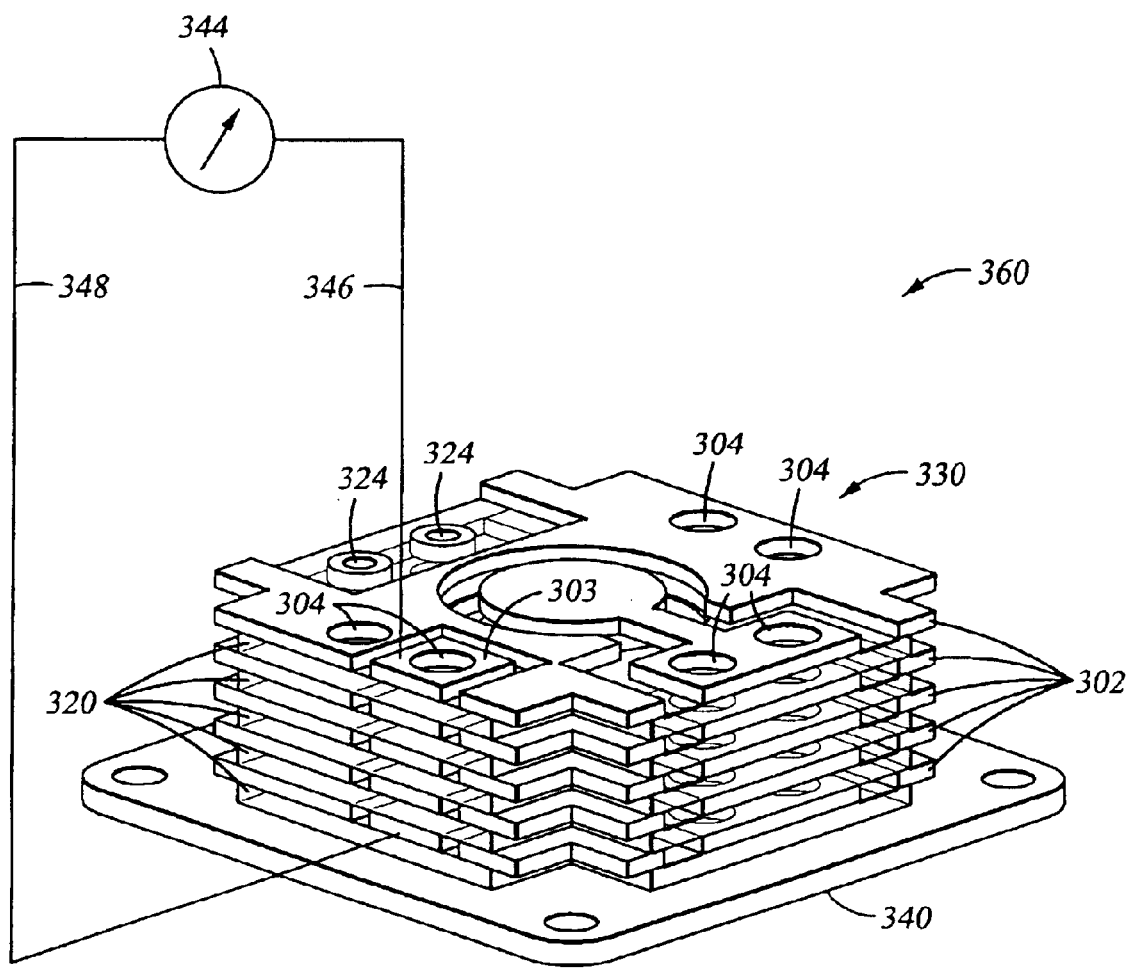
FIG. 3E shows a side view 360 of multi-layered structure 330 bonded to base plate 340. Electrical connectivity of the structure 330 is measured using meter 344.

FIG. 3E shows a side view 360 of multi-layered structure 330 bonded to base plate 340. Electrical connectivity of the structure 330 is measured using meter 344. Meter 344 is connected by line 346 to a block via 303 at the top of structure 330, and by line 348 to a block via 303 at the bottom of structure 330. Electrical conductivity of structure 330 is measured from the top to the bottom of the structure. Alternatively, structure 330 can be wired so that both contacts are at the bottom of the structure. This is particularly helpful if structure 330 is in an environment where, because of size or other restrictions, it is not possible or advisable to contact the structure 330 itself. In this manner, electrical conductivity measurements are taken solely through base plate 340.

FIGS. 4A through 4D show a series of structures which illustrate a second embodiment method of the invention. The embodiment described below, with reference to FIGS. 4A through 4D, is particularly useful when a conductive material coating having a thickness greater than 300 m is required.

Figure 4A:
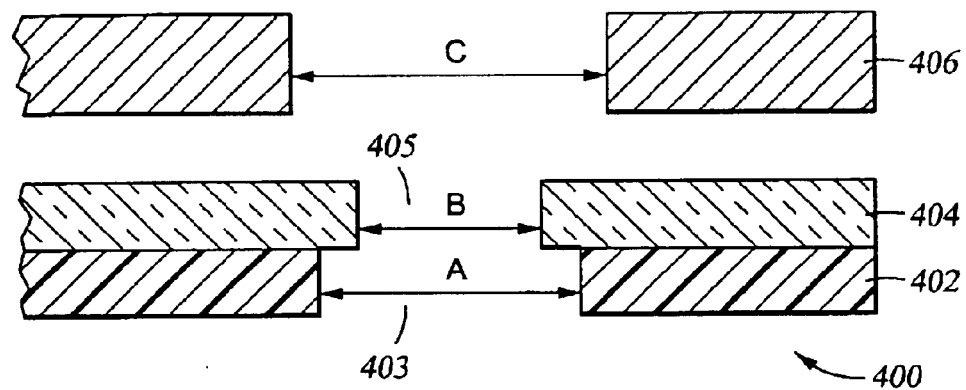
FIGS. 4A through 4E show a series of structures illustrating a second embodiment of the invention which pertains to a structure which includes at least one layer of glass which is anodically bonded to layers of conductive and/or semiconductive material.

FIG. 4A shows a schematic of a cross-section of a starting structure 400 for performing the second embodiment method. Structure 400 comprises a glass layer 404 overlying and anodically bonded to a silicon wafer 402. Anodic bonding was performed at a voltage of 500 V and a temperature of 400° C., for a time period of 5 minutes, as described above.

Both silicon wafer 402 and glass layer 404 have through-holes (403, 405, respectively) formed therein. The diameter A of through-hole 403 formed in silicon wafer 402 is larger than the diameter B of through-hole 405 formed in glass layer 404. Diameter A of through-hole 403 is typically within the range of about 0.1 mm to about 1 mm. In the example illustrated in FIG. 4A, the diameter A of through-hole 403 was 0.7 mm. Diameter B of through-hole 405 is typically within the range of about 0.1 mm to about 1 mm. In the example illustrated in FIG. 4A, the diameter B of through-hole 405 was 0.4 mm.

Aligned and clamped above glass layer 404 is a shadow mask 406 having an opening size C. The opening size C of shadow mask 406 is typically about 0.1 mm larger than the diameter A of through-hole 403. In the example illustrated in FIG. 4A, the opening size C of shadow mask 406 was 0.8 mm.

Figure 4B:
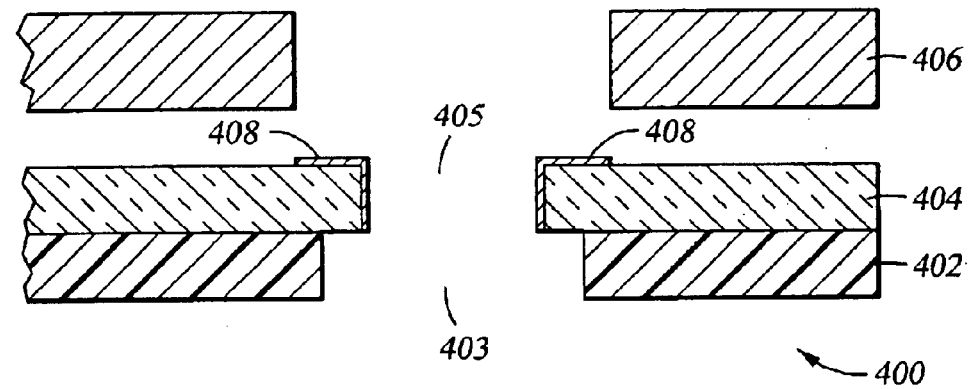

Referring to FIG. 4B, a first layer 408 of a conductive material was deposited by evaporation through shadow mask 406 at an angle θ over an interior surface of through-hole 405 and over a portion of an upper surface of glass layer 404. The thickness of first conductive material layer 408 is typically within the range of about 0.1 μm to about 0.3 μm. In the example illustrated in FIG. 4B, the conductive material was aluminum, and aluminum layer 408 had a thickness of about 0.2 μm.

Figure 4C:
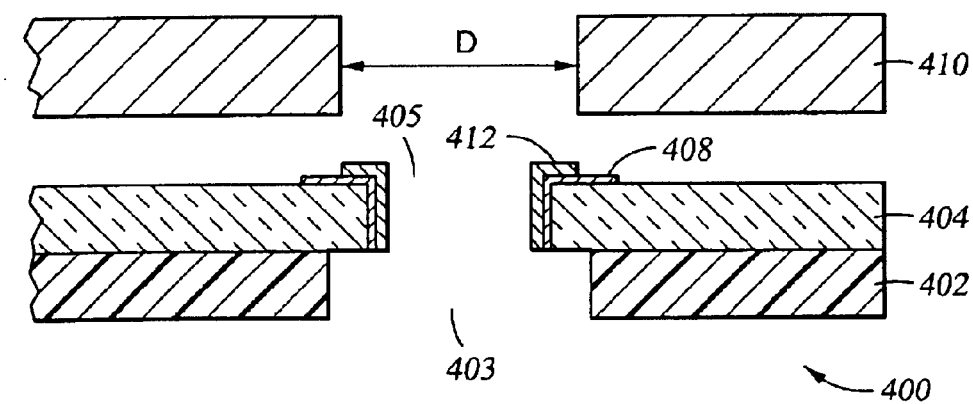

Referring to FIG. 4C, the first shadow mask 406 was removed and a second shadow mask 410 was clamped above glass layer 404. The opening size D of second shadow mask 410 must be smaller than the diameter A of through-hole 403. The opening size D of shadow mask 410 is typically about 0.1 mm smaller than the diameter A of through-hole 403. In the example illustrated in FIG. 4C, the opening size D of shadow mask 410 was 0.5 mm.

A second layer 412 of conductive material was then deposited through shadow mask 410 over an interior surface of through-hole 405 and over a portion of an upper surface of glass layer 404. Because the opening size D of second shadow mask 410 is smaller than the opening size C of first shadow mask 406 (which was used during the deposition of first conductive material layer 408), the upper surface portion of glass layer 404 which is covered by second conductive material layer 412 is less than the upper surface portion of glass layer 404 which is covered by first conductive material layer 408. The minimum thickness required for second conductive material layer 412 is a function of the roughness of the interior surface of through-hole 405. Typically, the required conductive coating thickness is equal to or greater than the surface roughness measurement. In the example illustrated in FIG. 4C, the conductive material was aluminum, and aluminum layer 412 had a thickness of about 2.0 μm.

Figure 4D:
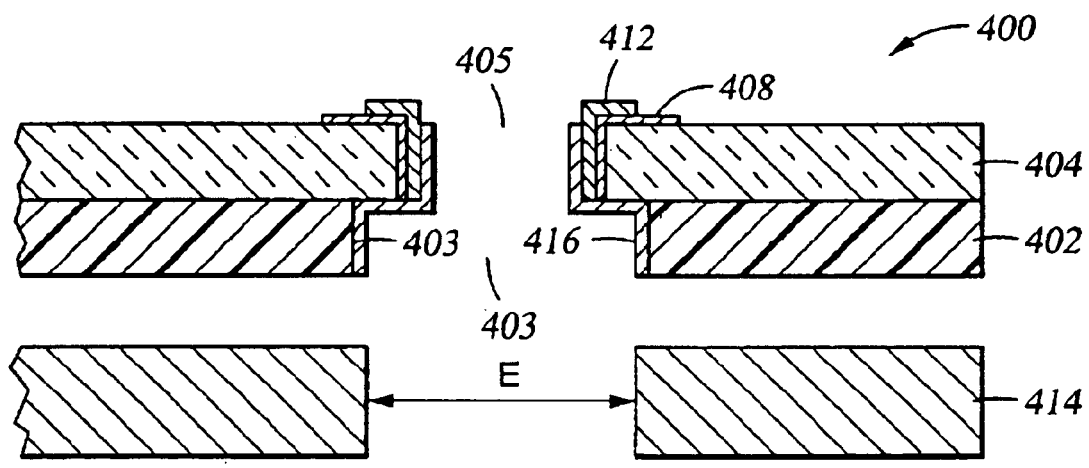

Referring to FIG. 4D, the second shadow mask 412 was removed and a third shadow mask 414 was clamped above silicon wafer 402. The opening size E of second shadow mask 414 must be smaller than the diameter A of through-hole 403. The opening size E of shadow mask 414 is typically about 0.1 mm smaller than the diameter A of through-hole 403. In the example illustrated in FIG. 4D, the opening size E of shadow mask 414 was 0.5 mm.

A third layer 416 of conductive material was then deposited through shadow mask 414 over an interior surface of through-hole 403, an interior surface of through-hole 405, and over a portion of a lower surface of glass layer 404. The minimum thickness required for third conductive material layer 416 is a function of the roughness of the interior surface of through-hole 403. Typically, the required conductive coating thickness is equal to or greater than the surface roughness measurement. In the example illustrated in FIG. 4D, the conductive material was aluminum, and aluminum layer 416 had a thickness of about 2.0 μm.

Figure 4E:
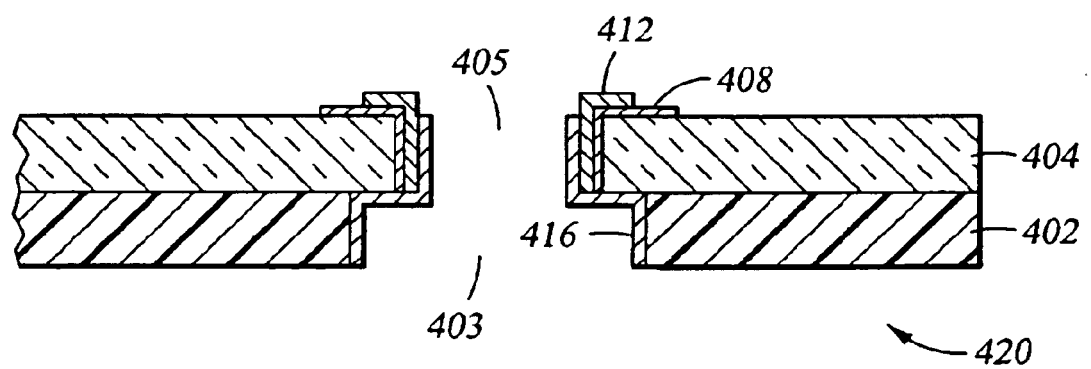

FIG. 4E shows the final substrate structure 420 after removal of third shadow mask 414. The method described above can be used to prepare basic substrate stack "units" 420 which can be stacked and anodically bonded together to form an electrically connected, multi-unit substrate structure. The procedure for stacking and bonding multiple substrate structures will be described below with respect to the following embodiment of the invention.

In a variation on the above embodiment, thick conductive material layer 416 is applied through shadow mask E prior to the deposition of thin conductive material layer 408 and thick conductive material layer 412 through shadow masks C and D, respectively.

An alternative embodiment of the above method includes only two conductive material layer deposition steps (i.e., the step d) conductive material layer deposition step of the above embodiment is omitted). This embodiment is particularly useful for use with glass through-holes having an aspect ratio of 2:1 or less, that is, the diameter of the through-hole is at least 50% of the thickness of the glass layer (i.e., the "height" of the through-hole). If the aspect ratio of the through-hole is greater than about 2:1, it may be difficult to entirely coat the surface of the through-hole with metal.

Figure 5A:
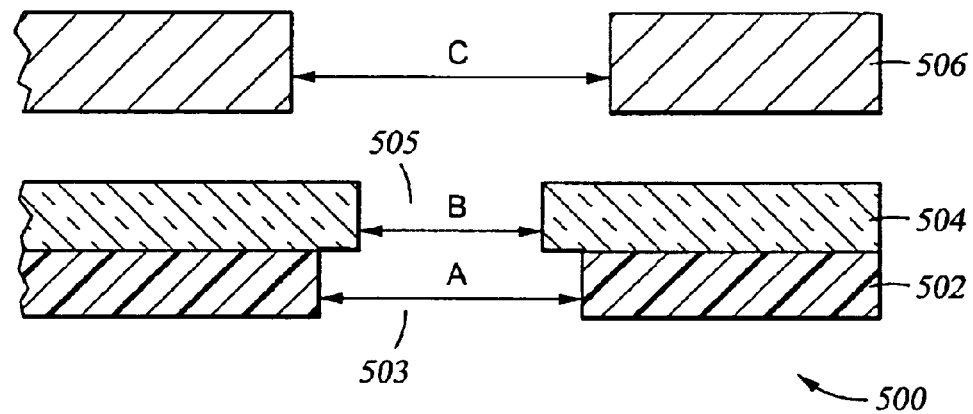
FIGS. 5A through 5F show a series of structures illustrating an alternative embodiment of the invention which pertains to a structure which includes at least one layer of glass which is anodically bonded to layers of conductive and/or semiconductive material.

FIG. 5A shows a schematic of a cross-section of a starting structure 500 for performing the alternative embodiment method. Structure 500 comprises a glass layer 504 overlying and anodically bonded to a silicon wafer 502. Both silicon wafer 502 and glass layer 504 have through-holes (503, 505, respectively) formed therein. The diameter A of through-hole 503 formed in silicon wafer 502 is larger than the diameter B of through-hole 505 formed in glass layer 504. Diameter A of through-hole 503 is typically within the range of about 0.1 mm to about 1 mm. Diameter B of through-hole 505 is typically within the range of about 0.1 mm to about 1 mm, but should be smaller than the diameter A of through-hole 503.

Aligned and clamped above glass layer 504 is a shadow mask 506 having an opening size C. The opening size C of shadow mask 506 is typically about 0.1 mm larger than the diameter A of through-hole 403.

Figure 5B:
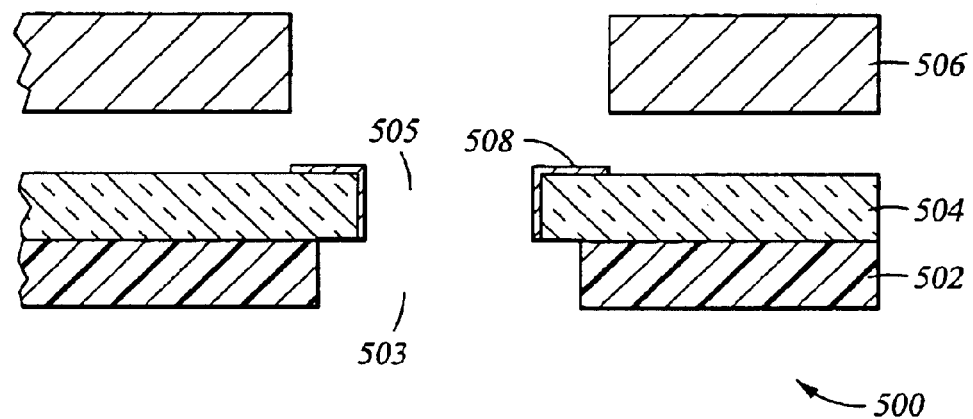

Referring to FIG. 5B, a first layer 508 of a conductive material is deposited through shadow mask 506 at an angle θ over an interior surface of through-hole 505 and over a portion of an upper surface of glass layer 504. The thickness of first conductive material layer 508 is typically within the range of about 0.1 μm to about 0.3 μm.

Figure 5C:
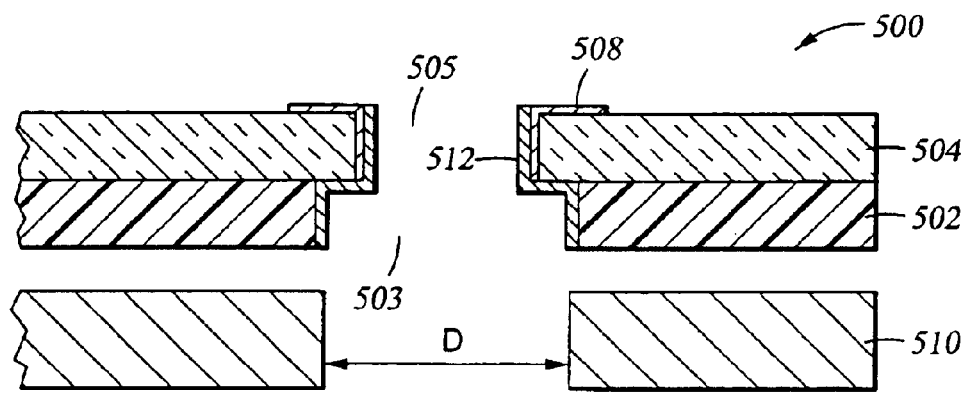

Referring to FIG. 5C, the first shadow mask 506 was removed and a second shadow mask 510 was clamped above silicon wafer 502. The opening size D of second shadow mask 510 must be smaller than the diameter A of through-hole 403. The opening size D of shadow mask 510 is typically about 0.1 mm smaller than the diameter A of through-hole 403.

A second layer 512 of conductive material was then deposited through shadow mask 510 over an interior surface of through-hole 503, an interior surface of through-hole 505, and over a portion of a lower surface of glass layer 504. The minimum thickness required for second conductive material layer 512 is a function of the roughness of the interior surface of through-hole 503. Typically, the required conductive coating thickness is equal to or greater than the surface roughness measurement.

Figure 5D:
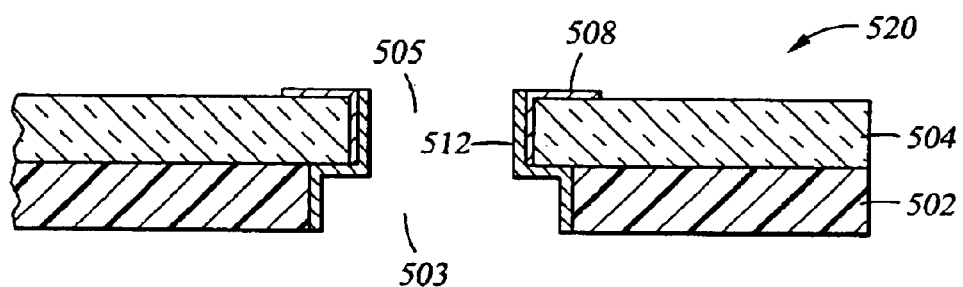

FIG. 5D shows the final substrate structure 520 after removal of second shadow mask 510.

The above method can be used to prepare basic "units" which can be stacked and anodically bonded together to form an electrically connected, multi-unit structure. Formation of such a multi-unit structure is illustrated in FIGS. 5E and 5F.

Figure 5E:
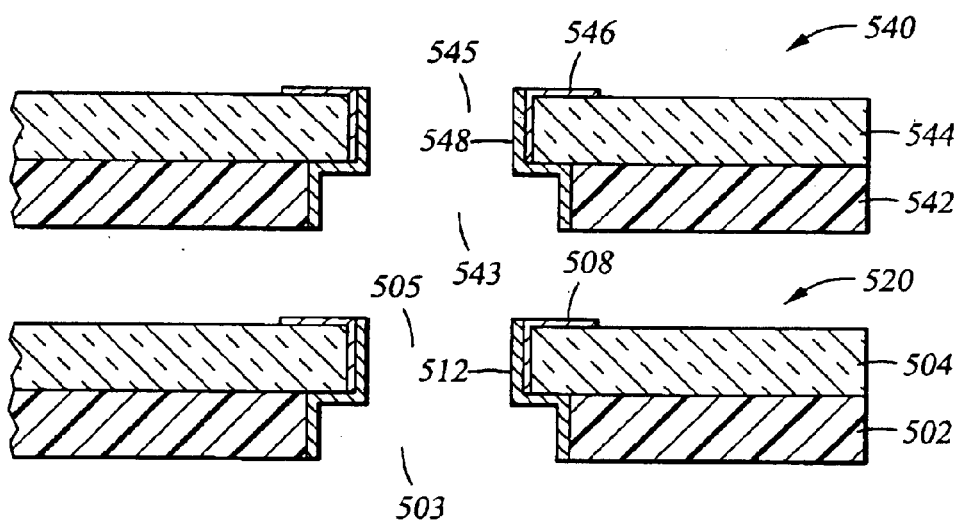

Referring to FIG. 5E, a second substrate structure 540 which has the same structure and is formed by the same process as substrate stack 520 is provided above substrate structure 520. FIG. 5E shows the second substrate structure 540 prior to alignment with first substrate structure 520. Like first substrate structure 520, second substrate structure 540 includes a glass layer 544 which has been anodically bonded to a silicon wafer 542. Silicon wafer 542 and glass layer 544 include through-holes 543, 545, respectively. A first conductive material layer 546 overlies an interior surface of through-hole 545 and a portion of an upper surface of glass layer 544. A second conductive material layer 548 overlies an interior surface of through-hole 543, an interior surface of through-hole 545, and a portion of a lower surface of silicon wafer 542.

Figure 5F:
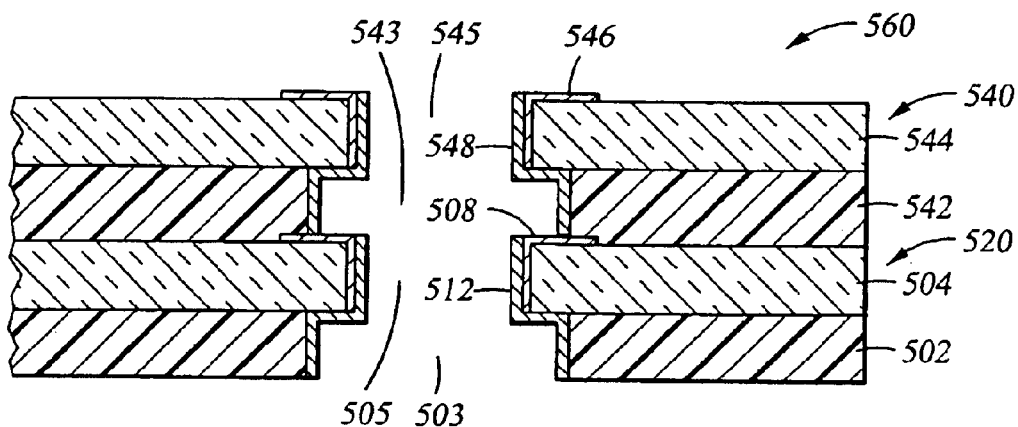

FIG. 5F shows the multi-unit structure 560 following alignment and anodic bonding of second substrate structure 540 to first substrate structure 520. Second substrate structure 540 is aligned with first substrate structure 520 such that silicon wafer 542 of second substrate structure 540 is in contact with glass layer 504 of first substrate structure 520. After anodic bonding of second substrate structure 540 to first substrate structure 520, first unit 520 and second unit 540 are electrically connected by means of conductive material layers 508, 512, and 548.

Additional "units" can be added to the multi-unit substrate structure by repeating the steps of the above method.

Figure 6A:
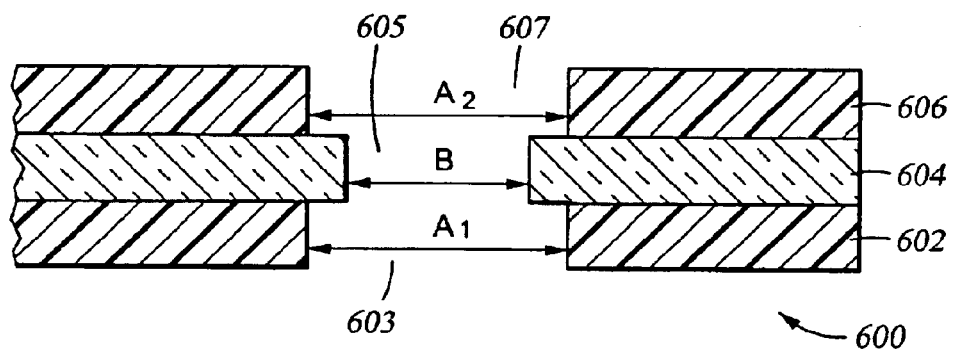
FIGS. 6A through 6C show a series of structures illustrating an alternative embodiment of the invention which pertains to a structure which includes at least one layer of glass which is anodically bonded to layers of conductive and/or semiconductive material.
Figure 6B:
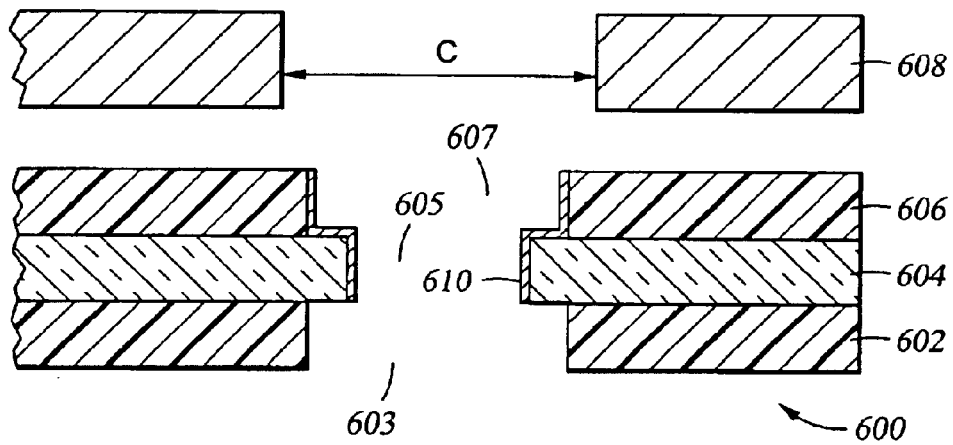
Figure 6C:
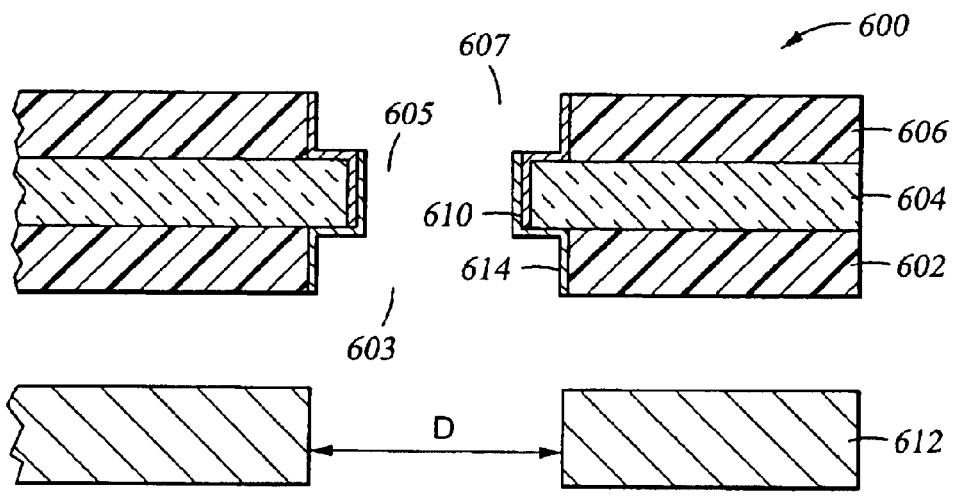

FIGS. 6A through 6C show a series of structures which illustrate a method of forming an electrically connected, three-layer substrate structure.

FIG. 6A shows a schematic of a cross-section of a starting structure 600 for performing this method. Structure 600 comprises a glass layer 604 sandwiched between and anodically bonded to each of two silicon layers, 602 and 606.

Silicon wafers 602, 606 and glass layer 604 have through-holes formed therein. The diameter $A_1$ of through-hole 603 formed in silicon wafer 602 and the diameter $A_2$ of through-hole 607 formed in silicon wafer 606 are larger or similar to the diameter B of through-hole 605 formed in glass layer 604. Diameters $A_1$ and $A_2$ of through-holes 603 and 607 are typically within the range of about 0.1 mm to about 1 mm. Diameter $A_2$ is typically the same as diameter $A_1$. Diameter B of through-hole 605 is typically within the range of about 0.1 mm to about 1 mm.

Referring to FIG. 6B, aligned and clamped above silicon layer 606 is a shadow mask 608 having an opening size C. The opening size C of first shadow mask 608 must be smaller than the diameter $A_2$ of through-hole 607. The opening size C of shadow mask 608 is typically about 0.1 mm smaller than the diameter $A_2$ of through-hole 607.

A first layer 610 of a conductive material is deposited through shadow mask 608 at an angle θ over interior surfaces of through-holes 607 and 605, and over a portion of an upper surface of glass layer 604. The minimum thickness required for first conductive material layer 610 is a function of the roughness of the interior surfaces of through-holes 607 and 605. Typically, the required conductive coating thickness is equal to or greater than the surface roughness measurement.

Referring to FIG. 6C, the first shadow mask 608 was removed and a second shadow mask 612 was clamped above silicon wafer 602. The opening size D of second shadow mask 612 must be smaller than the diameter $A_1$ of through-hole 603. The opening size D of shadow mask 612 is typically about 0.1 mm smaller than the diameter $A_1$ of through-hole 603.

A second layer 614 of conductive material was then deposited through shadow mask 612 over interior surfaces of through-holes 603 and 605, and over a portion of a lower surface of glass layer 604. The minimum thickness required for second conductive material layer 614 is a function of the roughness of the interior surfaces of through-holes 603 and 605. Typically, the required conductive coating thickness is equal to or greater than the surface roughness measurement.

After deposition of second conductive material layer 614, the shadow mask 612 is removed (not shown).

FIGS. 7A through 7G show a series of structures which illustrate another embodiment method of forming an electrically connected, multi-layer substrate structure.

Figure 7A:
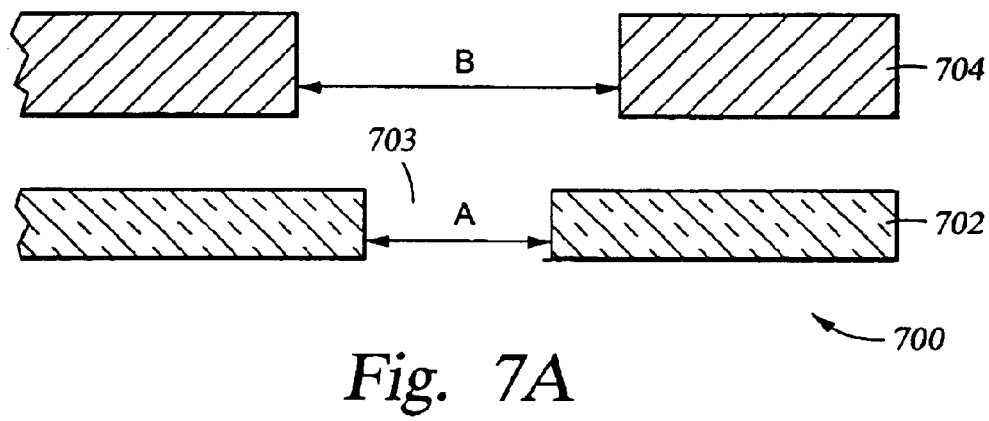
FIGS. 7A through 7G show a series of structures illustrating an alternative embodiment of the invention which pertains to a structure which includes at least one layer of glass which is anodically bonded to layers of conductive and/or semiconductive material.
Figure 7B:
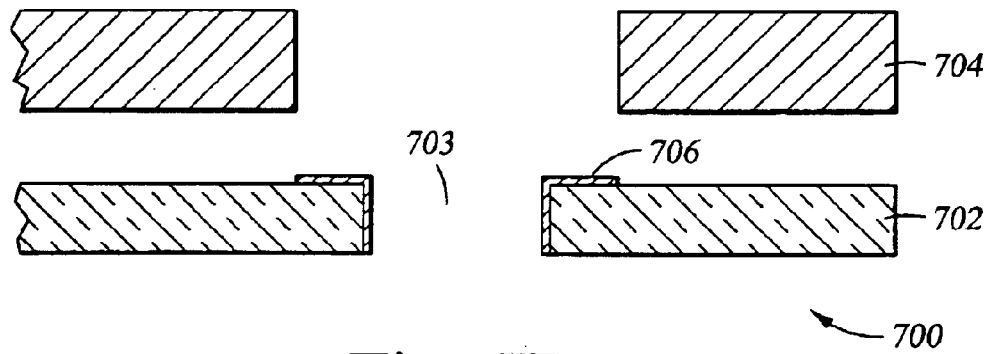

FIG. 7A shows a schematic of a cross-section of a starting structure 700 for performing this method. Structure 700 consists of a glass layer 702 having a through-hole with a diameter A formed therein. Aligned and clamped above an upper surface of glass layer 702 is a shadow mask 704 having an opening size B. The opening size B of shadow mask 704 is typically about 0.1 mm larger than the diameter A of through-hole 703.

A first layer 706 of a conductive material is deposited through shadow mask 704 at an angle θ over an interior surface of through-hole 703, and over a portion of an upper surface of glass layer 702. The thickness of first conductive material layer 706 is typically within the range of about 0.1 μm to about 0.3 μm.

Figure 7C:
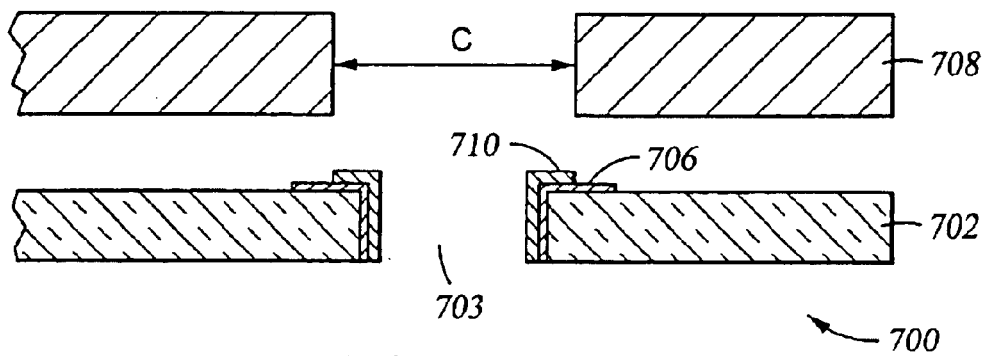

Referring to FIG. 7C, the first shadow mask 704 was removed and a second shadow mask 709 was clamped above the upper surface of glass layer 702. The opening size C of second shadow mask 708 must be smaller than the opening size B of shadow mask 704, but larger than the diameter A of through-hole 703.

A second layer 710 of conductive material was then deposited through shadow mask 708 over an interior surface of through-hole 703, and over a portion of an upper surface of glass layer 702. Because the opening size C of second shadow mask 708 is smaller than the opening size B of first shadow mask 704 (which was used during the deposition of first conductive material layer 706), the upper surface portion of glass layer 702 which is covered by second conductive material layer 710 is less than the upper surface portion of glass layer 702 which is covered by first conductive material layer 706. The minimum thickness required for second conductive material layer 710 is a function of the roughness of the interior surface of through-hole 703. Typically, the required conductive coating thickness is equal to or greater than the surface roughness measurement.

Figure 7D:
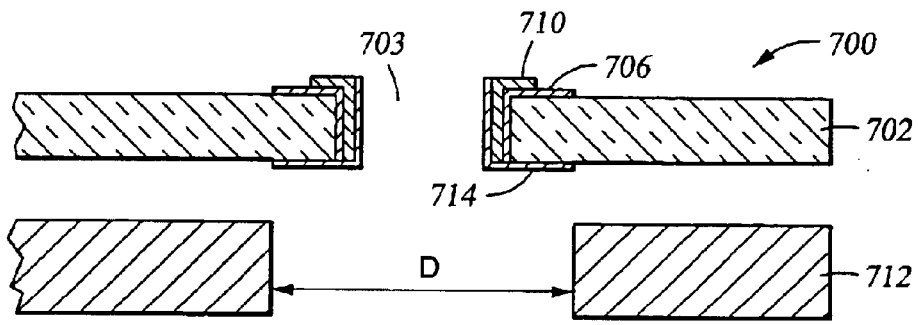

Referring to FIG. 7D, the second shadow mask 708 was removed and a third shadow mask 712 was clamped above a lower surface of glass layer 702. The opening size D of third shadow mask 712 is typically the same as the opening size B of first shadow mask B.

A third layer 714 of a conductive material is deposited through shadow mask 712 at an angle θ over an interior surface of through-hole 703, and over a portion of a lower surface of glass layer 702. The thickness of third conductive material layer 714 is typically within the range of about 0.1 μm to about 0.3 μm.

Figure 7E:
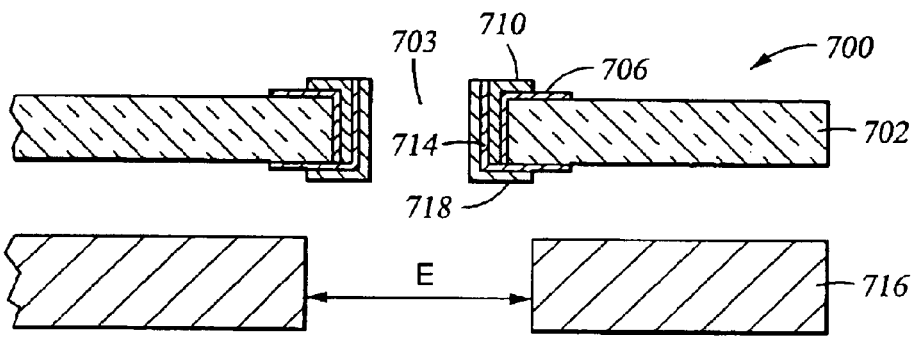

Referring to FIG. 7E, the third shadow mask 712 was removed and a fourth shadow mask 716 was clamped above the lower surface of glass layer 702. The opening size E of fourth shadow mask 716 must be smaller than the opening size D of third shadow mask 712, but larger than the diameter A of through-hole 703. The opening size E of fourth shadow mask 716 is typically the same as the opening size C of second shadow mask 708.

A fourth layer 718 of conductive material was then deposited through shadow mask 716 over an interior surface of through-hole 703, and over a portion of a lower surface of glass layer 702. Because the opening size E of fourth shadow mask 716 is smaller than the opening size D of third shadow mask 712 (which was used during the deposition of third conductive material layer 714), the lower surface portion of glass layer 702 which is covered by fourth conductive material layer 718 is less than the upper surface portion of glass layer 702 which is covered by third conductive material layer 714. The minimum thickness required for fourth conductive material layer 718 is a function of the roughness of the interior surface of through-hole 703. Typically, the required conductive coating thickness is equal to or greater than the surface roughness measurement.

Figure 7F:
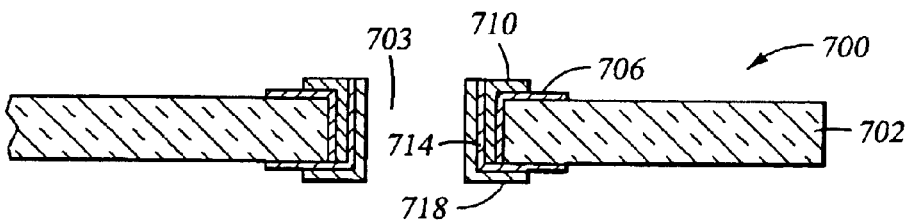

FIG. 7F shows the structure 700 after the removal of fourth shadow mask 718.

Figure 7G:
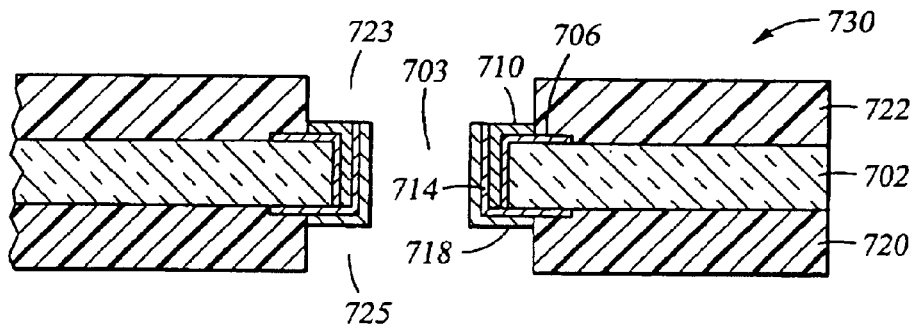

Referring to FIG. 7G, silicon layers 720 and 722 can be anodically bonded, sandwich-style, to glass layer 702, to provide an electrically connected, three-layer, substrate structure 730.

Figure 8A:
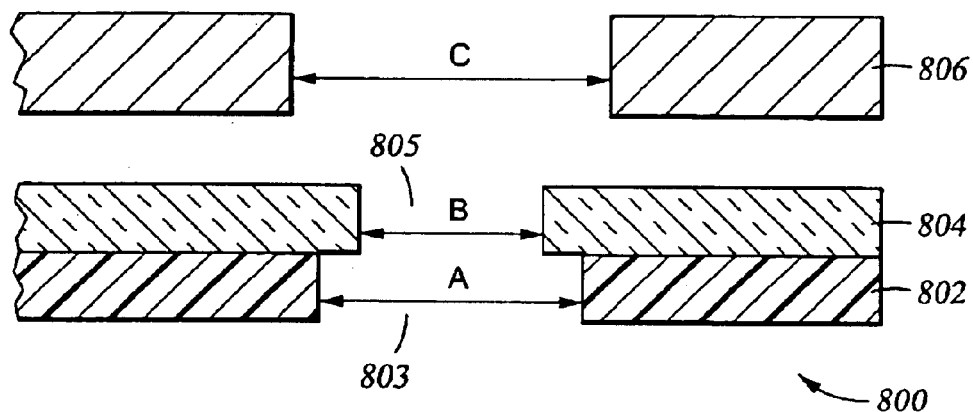
FIGS. 8A through 8C show a series of structures illustrating an alternative embodiment of the invention which pertains to a structure which includes at least one layer of glass which is anodically bonded to layers of conductive and/or semiconductive material.
Figure 8B:
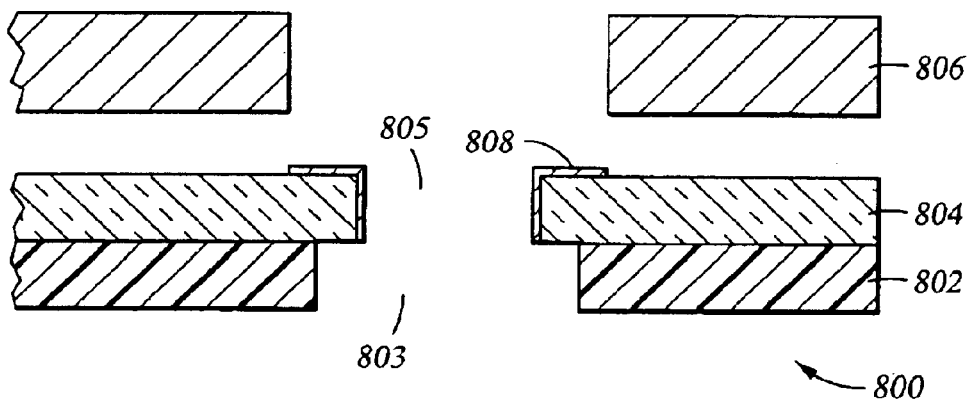
Figure 8C:
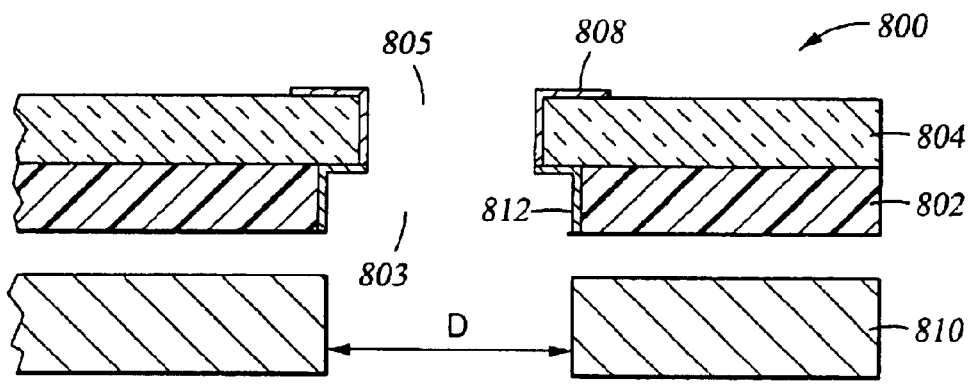

FIGS. 8A through 8C illustrate yet another embodiment of the method of the invention for forming an electrically connected substrate structure.

FIG. 8A shows a schematic of a cross-section of a starting structure 800 for performing this method. Structure 800 comprises a glass layer 804 overlying and anodically bonded a silicon layer 802. Both silicon wafer 802 and glass layer 804 have through-holes (803, 805, respectively) formed therein. The diameter A of through-hole 803 formed in silicon wafer 802 is larger than the diameter B of through-hole 805 formed in glass layer 804. Diameter A of through-hole 803 is typically within the range of about 0.1 mm to about 1 mm. Diameter B of through-hole 805 is typically within the range of about 0.1 mm to about 1 mm, but should be smaller than diameter A of through-hole 803.

Aligned and clamped above glass layer 804 is a shadow mask 806 having an opening size C. The opening size C of shadow mask 806 is typically about 0.1 mm larger than the diameter A of through-hole 803.

Referring to FIG. 8B, a first layer 808 of a conductive material is deposited through shadow mask 806 at an angle θ over an interior surface of through-hole 805 and over a portion of an upper surface of glass layer 804. The thickness of first conductive material layer 808 is typically within the range of about 0.1 μm to about 0.3 μm.

Referring to FIG. 8C, the first shadow mask 806 was removed and a second shadow mask 810 was clamped above silicon wafer 802. The opening size D of second shadow mask 810 must be smaller than the diameter A of through-hole 803. The opening size D of shadow mask 510 is typically about 0.1 mm smaller than the diameter A of through-hole 803.

A second layer 812 of conductive material was then deposited through shadow mask 810 over an interior surface of through-hole 803, an interior surface of through-hole 805, and over a portion of a lower surface of glass layer 804. The thickness of second conductive material layer 812 is typically within the range of about 0.1 μm to about 0.3 μm.

After deposition of second conductive material layer 812, the shadow mask 810 is removed (not shown).

Figure 9A:
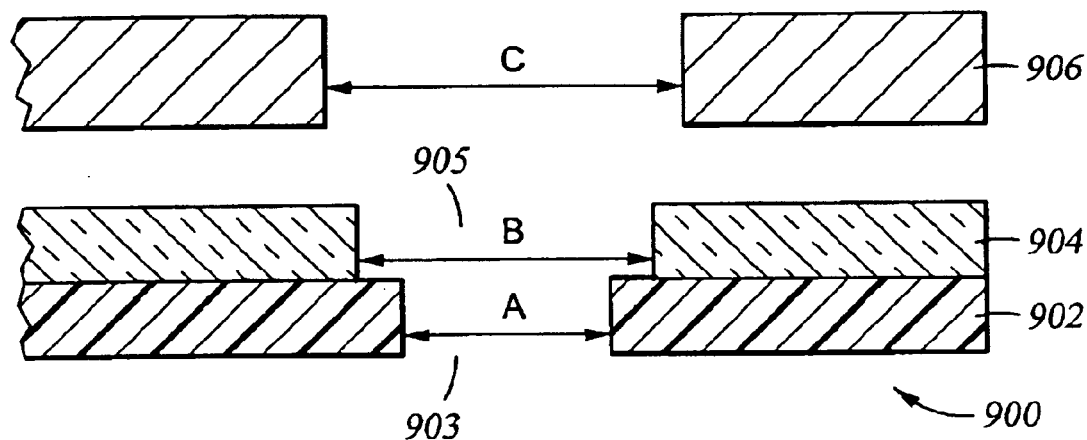
FIG. 9A shows a schematic of a cross-section of a structure 900 of a silicon wafer 902 bonded to a glass layer 904. Preferably, silicon wafer 902 is anodically bonded to glass layer 904. Both silicon wafer 902 and glass layer 904 have through-holes (903, 905, respectively) formed therein. The diameter A of through-hole 903 formed in silicon wafer 902 is smaller than the diameter B of through-hole 905 formed in glass layer 904. Positioned above glass layer 904 is a shadow mask 906 having an opening size C.
Figure 9B:
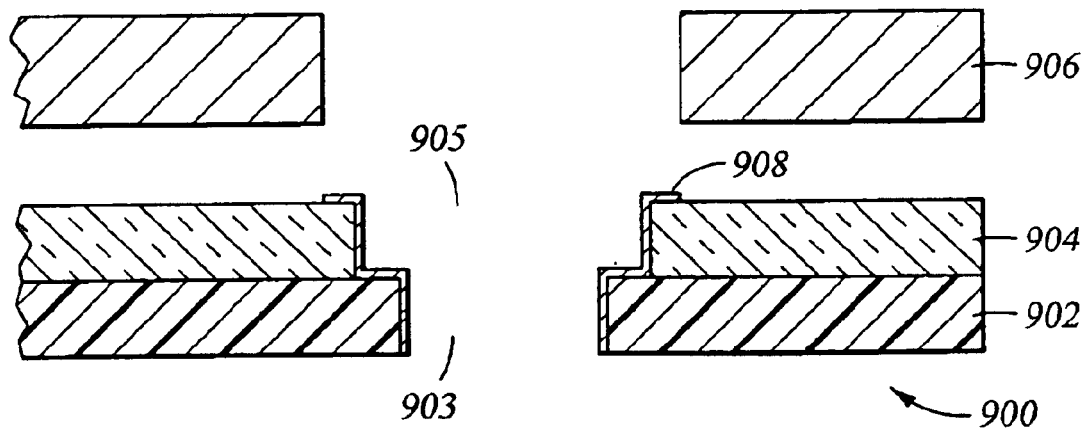
FIG. 9B shows the structure 900 of FIG. 9A after a layer of an electrically conductive material is applied to form a coating 908 over a portion of an upper surface of glass layer 904, an interior surface of through-hole 905, a portion of an upper surface of silicon layer 902, and an interior surface of through-hole 903.

FIGS. 9A–9B illustrate an embodiment of the method of the invention which involves the deposition of only one conductive material layer.

FIG. 9A shows a schematic of a cross-section of a starting structure 900 for performing this method. Structure 900 comprises a glass layer 904 overlying and anodically bonded a silicon layer 902. In one embodiment, both silicon wafer 902 and glass layer 904 have through-holes (903, 905, respectively) formed therein. Unlike the embodiment examples described above with respect to FIGS. 4–8, in this case, the diameter A of through-hole 903 formed in silicon wafer 902 is smaller than the diameter B of through-hole 905 formed in glass layer 904. Diameter A of through-hole 903 is typically within the range of about 0.1 mm to about 1 mm. Diameter B of through-hole 905 is typically within the range of about 0.1 mm to about 1 mm, but should be larger than the diameter A of through-hole 903. In an alternative embodiment, silicon wafer 902 does not include a through-hole.

Aligned and clamped above glass layer 904 is a shadow mask 906 having an opening size C. The opening size C of shadow mask 906 is typically about 0.1 mm larger than the diameter B of through-hole 903.

Referring to FIG. 9B, a layer 908 of a conductive material is deposited through shadow mask 906 at an angle θ over a portion of an upper surface of glass layer 904, an interior surface of through-hole 905, a portion of an upper surface of silicon layer 902, and an interior surface of through-hole 903. The thickness of conductive material layer 908 is typically within the range of about 0.1 μm to about 0.3 μm.

After deposition of conductive material layer 908, the shadow mask 906 is removed (not shown).

While the invention has been described in detail above with reference to several embodiments, various modifications within the scope and spirit of the invention will be apparent to those of working skill in this technological field. Accordingly, the scope of the invention should be measured by the appended claims.

What is claimed is:

1. A method of preparing a vertical, electrically connected structure, comprising the steps of:
    a) providing a second substrate overlying a first substrate, wherein said first substrate and said second substrate comprise materials having similar coefficients of expansion, and wherein said second substrate has at least one through-hole formed therein;
    b) anodically bonding said first substrate to said a first surface of said second substrate;
    c) simultaneously depositing a layer of a conductive material over an interior surface of said at least one through-hole, an upper portion of said first substrate exposed in the area of said through-hole, and over a portion of a second surface of said second substrate surrounding said through-hole, thereby forming a conductive pad surrounding said through-hole; and
    d) anodically bonding a third substrate to said second surface of said second substrate, wherein said second substrate and said third substrate comprise materials having similar coefficients of expansion whereby said first substrate is electrically connected to said third substrate by means of said conductive material layer.

2. The method of claim 1, wherein said first substrate is silicon.

3. The method of claim 1 or claim 2, wherein said second substrate is glass.

4. The method of claim 1 or claim 2, wherein said third substrate is silicon.

5. The method of claim 3, wherein said third substrate is silicon.

6. The method of claim 1, wherein said conductive material is aluminum.

7. The method of claim 1 or claim 6, wherein said conductive material layer has a thickness within the range of about 100 nm to about 300 nm.

8. The method of claim 1, wherein said layer of conductive material is deposited using a shadow mask.

9. A method of preparing a vertical, electrically connected substrate structure, comprising the steps of:
   a) providing a second substrate overlying a first substrate, wherein said first substrate and said second substrate comprise materials having similar coefficients of expansion, wherein said first substrate has at least one through-hole formed therein, and said second substrate has at least one through-hole formed therein, wherein a diameter of said first substrate through-hole is larger than a diameter of said second substrate through-hole, and wherein said first substrate through-hole is in communication with said second substrate through-hole;
   b) anodically bonding said first substrate to said second substrate;
   c) depositing a first layer of a conductive material over an interior surface of said second substrate through-hole and over a portion of an upper surface of said second substrate;
   d) depositing a second layer of a conductive material over an interior surface of said second substrate through-hole and over a portion of an upper surface of said second substrate, wherein said upper surface portion which is covered by said second conductive material layer is less than said upper surface portion which is covered by said first conductive material layer; and
   e) depositing a third layer of a conductive material over an interior surface of said first substrate through-hole, an interior surface of said second substrate through-hole, and over a portion of a lower surface of said second substrate.

10. The method of claim 9, further comprising the following steps:
   f) providing a second substrate structure which has the same structure and is formed by the same process as the substrate structure formed in steps a)–e);
   g) aligning said second substrate structure with said first substrate structure such that said first substrate of said second substrate structure is in contact with said second substrate of said first substrate structure; and
   h) anodically bonding said second substrate structure to said first substrate structure, whereby said first substrate structure is electrically connected to said second substrate structure by means of said conductive material layers, and whereby all substrates in said first and second substrate structures are electrically connected.

11. The method of claim 9 or claim 10, wherein said first substrate is silicon.

12. The method of claim 9 or claim 10, wherein said second substrate is glass.

13. The method of claim 11, wherein said second substrate is glass.

14. The method of claim 9 or claim 10, wherein said conductive material is aluminum.

15. The method of claim 14, wherein said first conductive material layer has a thickness within the range of about 100 nm to about 300 nm.

16. The method of claim 9 or claim 10, wherein said first conductive material layer has a thickness within the range of about 100 nm to about 300 nm.

17. The method of claim 14, wherein said second conductive material layer has a thickness which is equal to or greater than a surface roughness measurement of said second substrate through-hole.

18. The method of claim 9 or claim 10, wherein said second conductive material layer has a thickness which is equal to or greater than a surface roughness measurement of said second substrate through-hole.

19. The method of claim 14, wherein said third conductive material layer has a thickness which is equal to or greater than a surface roughness measurement of said first substrate through-hole.

20. The method of claim 9 or claim 10, wherein said third conductive material layer has a thickness which is equal to or greater than a surface roughness measurement of said first substrate through-hole.

21. The method of claim 9 or claim 10, wherein said layers of conductive material are deposited by evaporation through shadow masks.

22. The method of claim 21, wherein an opening size of a shadow mask used to deposit said first conductive material layer is larger than an opening size of a shadow mask used to deposit said second conductive material layer.

23. The method of claim 21, wherein an opening size of a shadow mask used to deposit said third conductive material layer is substantially the same as an opening size of a shadow mask used to deposit said second conductive material layer.

24. A method of preparing a vertical, electrically connected substrate structure, comprising the steps of:
   a) providing a second substrate overlying a first substrate, wherein said first substrate and said second substrate comprise materials having similar coefficients of expansion, wherein said first substrate has at least one through-hole formed therein, and said second substrate has at least one through-hole formed therein, wherein a diameter of said first substrate through-hole is larger than a diameter of said second substrate through-hole, and wherein said first substrate through-hole is in communication with said second substrate through-hole;
   b) anodically bonding said first substrate to said second substrate to form a first substrate structure;
   c) depositing a first layer of a conductive material over an interior surface of said second substrate through-hole and over a portion of an upper surface of said second substrate; and
   d) depositing a second layer of a conductive material over an interior surface of said first substrate through-hole, an interior surface of said second substrate through-hole, and over a portion of a lower surface of said second substrate.

25. The method of claim 24, further comprising the following steps:
   e) providing a second substrate structure which has the same structure as said first substrate structure, and is formed by the same process as said first substrate structure;
   f) aligning said second substrate structure with said first substrate structure such that said first substrate of said second substrate structure is in contact with said second substrate of said first substrate structure; and
   g) anodically bonding said second substrate structure to said first substrate structure, whereby said first substrate structure is electrically connected to said second substrate structure by means of said conductive material layers, and whereby all substrates in said first and second substrate structures are electrically connected.

26. The method of claim 24 or claim 25, wherein said first substrate is silicon.

27. The method of claim 24 or claim 25, wherein said second substrate is glass.

28. The method of claim 26, wherein said second substrate is glass.

29. The method of claim 24 or claim 25, wherein said conductive material is aluminum.

30. The method of claim 29, wherein said first conductive material layer has a thickness within the range of about 100 nm to about 300 nni.

31. The method of claim 24 or claim 25, wherein said first conductive material layer has a thickness within the range of about 100 nin to about 300 um.

32. The method of claim 29, wherein said second conductive material layer has a thickness which is equal to or greater than a surface roughness measurement of said first substrate through-hole.

33. The method of claim 24 or claim 25, wherein said second conductive material layer has a thickness which is equal to or greater than a surface roughness measurement of said first substrate through-hole.

34. The method of claim 29, wherein said second conductive material layer has a thickness within the range of about 100 nm to about 300 nm.

35. The method of claim 24 or claim 25, wherein said second conductive material layer has a thickness within the range of about 100 nm to about 300 nm.

36. The method of claim 24 or claim 25, wherein said layers of conductive material are deposited by evaporation through shadow masks.

37. The method of claim 36, wherein an opening size of a shadow mask used to deposit said first conductive material layer is larger than an opening size of a shadow mask used to deposit said second conductive material layer.

38. A method of preparing a vertical, electrically connected substrate structure, comprising the steps of:
   a) providing a second substrate sandwiched between a first substrate and a third substrate, wherein said first substrate, said second substrate, and said third substrate comprise materials having similar coefficients of expansion, wherein said first substrate, said second substrate, and said third substrate each has at least one through-bole formed therein, and wherein a diameter of said first substrate through-hole and a diameter of said third substrate through-hole are larger than a diameter of said second substrate through-hole, and wherein said first substrate through-hole is in communication with said second substrate through-hole, and said second substrate through-hole is in communication with said third substrate through-hole;
   b) anodically bonding said second substrate to said first substrate and said third substrate;
   c) depositing a first layer of a conductive material over an interior surface of said third substrate through-hole, a portion of an upper surface of said second substrate, and an interior surface of said second substrate; and
   d) depositing a second layer of a conductive material over an interior surface of said first substrate through-hole, a portion of a lower surface of said second substrate, and an interior surface of said second substrate through-hole.

39. The method of claim 38, wherein said layers of conductive material are deposited by evaporation through shadow masks.

40. The method of claim 39, wherein an opening size of a shadow mask used to deposit said second conductive material layer is substantially the same as an opening size of a shadow mask used to deposit said first conductive material layer.

41. A method of preparing a vertical, electrically connected substrate structure, comprising the steps of:
   a) providing a first substrate, wherein said first substrate has at least one through-hole formed therein;
   b) depositing a first layer of a conductive material over a portion of an upper surface of said first substrate and over an interior surface of said first substrate through-hole;
   c) depositing a second layer of a conductive material over a portion of an upper surface of said first substrate and over an interior surface of said first substrate through-hole, wherein said upper surface portion which is covered by said second conductive material layer is less than said upper surface portion which is covered by said first conductive material layer;
   d) depositing a third layer of a conductive material over a portion of a lower surface of said first substrate and over an interior surface of said first substrate through-hole; and
   e) depositing a fourth layer of a conductive material over a portion of a lower surface of said first substrate and over an interior surface of said first substrate through-hole, wherein said lower surface portion which is covered by said fourth conductive material layer is less than said upper surface portion which is covered by said third conductive material layer.

42. The method of claim 41, further comprising the following steps:
   f) providing a second substrate and a third substrate, wherein said second substrate and said third substrate comprise materials having a similar coefficient of expansion as said first substrate;
   g) aligning said second substrate over an upper surface of said first substrate;
   h) aligning said third substrate over a lower surface of said first substrate; and
   i) anodically bonding said second substrate and said third substrate to said first substrate, whereby said second substrate is electrically connected to said third substrate by means of said conductive material layers.

43. The method of claim 41 or claim 42, wherein a thickness of said second conductive material layer is greater than a thickness of said first conductive material layer.

44. The method of claim 41 or claim 42, wherein a thickness of said fourth conductive material layer is greater than a thickness of said third conductive material layer.

45. A method of preparing a vertical, electrically connected substrate structure, comprising the steps of:
   a) providing a second substrate overlying a first substrate, wherein said first substrate and said second substrate comprise materials having similar coefficients of expansion, wherein said first substrate has at least one through-hole formed therein, and said second substrate has at least one through-hole formed therein, wherein a diameter of said first substrate through-hole is smaller than a diameter of said second substrate through-hole, and wherein said first substrate through-hole is in communication with said second substrate through-hole;
   b) anodically bonding said first substrate to said second substrate; and
   c) depositing a first layer of a conductive material over a portion of an upper surface of said second substrate, an interior surface of said second substrate through-hole, a portion of an upper surface of said first substrate, and an interior surface of said first substrate through-hole.

46. The method of claim 45, further comprising the following steps:

d) providing a second substrate structure which has the same structure and is formed by the same process as the substrate structure formed in steps a)–c);

e) aligning said second substrate structure with said first substrate structure such that said first substrate of said second substrate structure is in contact with said second substrate of said first substrate structure; and f) anodically bonding said second substrate structure to said first substrate structure, whereby said first substrate structure is electrically connected to said second substrate structure by means of said conductive material layers, and whereby all substrates in said first and second substrate structures are electrically connected.

* * * * *